US009190413B2

(12) United States Patent
Kato et al.

(10) Patent No.: US 9,190,413 B2
(45) Date of Patent: Nov. 17, 2015

(54) SEMICONDUCTOR DEVICE

(75) Inventors: Kiyoshi Kato, Kanagawa (JP); Shuhei Nagatsuka, Kanagawa (JP); Hiroki Inoue, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 301 days.

(21) Appl. No.: 13/019,330

(22) Filed: Feb. 2, 2011

(65) Prior Publication Data

US 2011/0198593 A1 Aug. 18, 2011

(30) Foreign Application Priority Data

Feb. 5, 2010 (JP) ................................ 2010-024579

(51) Int. Cl.
*H01L 27/105* (2006.01)
*H01L 27/115* (2006.01)
*H01L 27/12* (2006.01)

(52) U.S. Cl.
CPC .......... *H01L 27/105* (2013.01); *H01L 27/1052* (2013.01); *H01L 27/1156* (2013.01); *H01L 27/1225* (2013.01)

(58) Field of Classification Search
CPC ..................... H01L 27/11514; H01L 27/0688; H01L 27/11597; H01L 27/11578; H01L 27/11568; H01L 27/11551
USPC ................... 257/390, 401, 724, 777, E27.026
See application file for complete search history.

(56) References Cited

U.S. PATENT DOCUMENTS 4,466,081 A 8/1984 Masuoka
4,633,438 A 12/1986 Kume et al.

(Continued)

FOREIGN PATENT DOCUMENTS

CN 101047033 A 10/2007
CN 101097770 A 1/2008

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Minh-Loan Tran
*Assistant Examiner* — Leslie Pilar Cruz
(74) *Attorney, Agent, or Firm* — Fish & Richardson P.C.

(57) ABSTRACT

A semiconductor device with a novel structure in which stored data can be held even when power is not supplied and there is no limitation on the number of times of writing. In the semiconductor device, a plurality of memory cells each including a first transistor, a second transistor, and a capacitor is provided in matrix and a wiring (also called a bit line) for connecting one memory cell to another memory cell and a source or drain electrode of the first transistor are electrically connected to each other through a source or drain electrode of the second transistor. Accordingly, the number of wirings can be smaller than that in the case where the source or drain electrode of the first transistor and the source or drain electrode of the second transistor are connected to different wirings. Thus, the degree of integration of the semiconductor device can be increased.

18 Claims, 24 Drawing Sheets

144 148b 156 156 142a 144 146 152
142a 146 164 150 148b 143a 148a 143b 130 154
A1 A2 B1 B2
110 108 110 116 124 164 100 126
160 116 106 120 108 128 160 162 142b

(56) References Cited

U.S. PATENT DOCUMENTS 5,041,884 A 8/1991 Kumamoto et al.
5,349,366 A 9/1994 Yamazaki et al.
5,429,968 A 7/1995 Koyama
5,712,817 A 1/1998 Suh
5,731,856 A 3/1998 Kim et al.
5,744,864 A 4/1998 Cillessen et al.
5,801,983 A 9/1998 Saeki
5,994,735 A 11/1999 Maeda et al.
6,127,209 A 10/2000 Maeda et al.
6,127,702 A 10/2000 Yamazaki et al.
6,191,442 B1 2/2001 Matsufusa
6,285,055 B1 9/2001 Gosain et al.
6,294,274 B1 9/2001 Kawazoe et al.
6,300,683 B1 * 10/2001 Nagasaka et al. ............ 257/774
6,314,017 B1 11/2001 Emori et al.
6,420,751 B1 7/2002 Maeda et al.
6,445,026 B1 9/2002 Kubota et al.
6,563,174 B2 5/2003 Kawasaki et al.
6,727,522 B1 4/2004 Kawasaki et al.
6,882,006 B2 4/2005 Maeda et al.
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,189,992 B2 3/2007 Wager, III et al.
7,211,825 B2 5/2007 Shih et al
7,282,782 B2 10/2007 Hoffman et al.
7,297,977 B2 11/2007 Hoffman et al.
7,323,356 B2 1/2008 Hosono et al.
7,339,187 B2 3/2008 Wager, III et al.
7,385,224 B2 6/2008 Ishii et al.
7,402,506 B2 7/2008 Levy et al.
7,411,209 B2 8/2008 Endo et al.
7,453,065 B2 11/2008 Saito et al.
7,453,087 B2 11/2008 Iwasaki
7,462,862 B2 12/2008 Hoffman et al.
7,468,304 B2 12/2008 Kaji et al.
7,501,293 B2 3/2009 Ito et al.
7,674,650 B2 3/2010 Akimoto et al.
7,732,819 B2 6/2010 Akimoto et al.
7,742,351 B2 6/2010 Inoue et al.
7,760,552 B2 7/2010 Miyake et al.
7,791,074 B2 9/2010 Iwasaki
7,830,706 B2 11/2010 Hanzawa et al.
7,888,207 B2 2/2011 Wager, III et al.
7,935,582 B2 5/2011 Iwasaki
7,956,361 B2 6/2011 Iwasaki
7,983,109 B2 7/2011 Hanzawa et al.
8,018,776 B2 9/2011 Miyake et al.
8,054,121 B2 11/2011 Kato
8,094,489 B2 1/2012 Hanzawa et al.
8,154,024 B2 4/2012 Iwasaki
8,158,974 B2 4/2012 Yano et al.
8,212,248 B2 7/2012 Itagaki et al.
8,314,637 B2 11/2012 Kato et al.
8,339,828 B2 12/2012 Yamazaki et al.
8,339,836 B2 12/2012 Yamazaki et al.
8,456,940 B2 6/2013 Hanzawa et al.
2001/0046027 A1 11/2001 Tai et al.
2002/0056838 A1 5/2002 Ogawa
2002/0096702 A1 7/2002 Ishii et al.
2002/0132454 A1 9/2002 Ohtsu et al.
2003/0189401 A1 10/2003 Kido et al.
2003/0218221 A1 11/2003 Wager, III et al.
2003/0218222 A1 11/2003 Wager, III et al.
2004/0038446 A1 2/2004 Takeda et al.
2004/0127038 A1 7/2004 Carcia et al.
2005/0017302 A1 1/2005 Hoffman
2005/0199959 A1 9/2005 Chiang et al.
2005/0237786 A1 10/2005 Atwood et al.
2006/0035452 A1 2/2006 Carcia et al.
2006/0043377 A1 3/2006 Hoffman et al.
2006/0091793 A1 5/2006 Baude et al.
2006/0108529 A1 5/2006 Saito et al.
2006/0108636 A1 5/2006 Sano et al.
2006/0110867 A1 5/2006 Yabuta et al.
2006/0113536 A1 6/2006 Kumomi et al.
2006/0113539 A1 6/2006 Sano et al.
2006/0113549 A1 6/2006 Den et al.
2006/0113565 A1 6/2006 Abe et al.
2006/0169973 A1 8/2006 Isa et al.
2006/0170111 A1 8/2006 Isa et al.
2006/0197092 A1 9/2006 Hoffman et al.
2006/0208977 A1 9/2006 Kimura
2006/0228974 A1 10/2006 Thelss et al.
2006/0231882 A1 10/2006 Kim et al.
2006/0238135 A1 10/2006 Kimura
2006/0244107 A1 11/2006 Sugihara et al.
2006/0284171 A1 12/2006 Levy et al.
2006/0284172 A1 12/2006 Ishii
2006/0292777 A1 12/2006 Dunbar
2007/0024187 A1 2/2007 Shin et al.
2007/0046191 A1 3/2007 Saito
2007/0047286 A1 3/2007 Miki
2007/0052025 A1 3/2007 Yabuta
2007/0054507 A1 3/2007 Kaji et al.
2007/0090365 A1 4/2007 Hayashi et al.
2007/0108446 A1 5/2007 Akimoto
2007/0152217 A1 7/2007 Lai et al.
2007/0172591 A1 7/2007 Seo et al.
2007/0187678 A1 8/2007 Hirao et al.
2007/0187760 A1 8/2007 Furuta et al.
2007/0194379 A1 8/2007 Hosono et al.
2007/0252928 A1 11/2007 Ito et al.
2007/0272922 A1 11/2007 Kim et al.
2007/0287296 A1 12/2007 Chang
2008/0006877 A1 1/2008 Mardilovich et al.
2008/0038882 A1 2/2008 Takechi et al.
2008/0038929 A1 2/2008 Chang
2008/0050595 A1 2/2008 Nakagawara et al.
2008/0073653 A1 3/2008 Iwasaki
2008/0083950 A1 4/2008 Pan et al.
2008/0087932 A1 * 4/2008 Son et al. ...................... 257/315
2008/0093595 A1 4/2008 Song et al.
2008/0106191 A1 5/2008 Kawase
2008/0108198 A1 5/2008 Wager, III et al.
2008/0128689 A1 6/2008 Lee et al.
2008/0129195 A1 6/2008 Ishizaki et al.
2008/0166834 A1 7/2008 Kim et al.
2008/0182358 A1 7/2008 Cowdery-Corvan et al.
2008/0224133 A1 9/2008 Park et al.
2008/0254569 A1 10/2008 Hoffman et al.
2008/0258139 A1 10/2008 Ito et al.
2008/0258140 A1 10/2008 Lee et al.
2008/0258141 A1 10/2008 Park et al.
2008/0258143 A1 10/2008 Kim et al.
2008/0296568 A1 12/2008 Ryu et al.
2009/0002590 A1 1/2009 Kimura
2009/0068773 A1 3/2009 Lai et al.
2009/0073325 A1 3/2009 Kuwabara et al.
2009/0114910 A1 5/2009 Chang
2009/0134399 A1 5/2009 Sakakura et al.
2009/0152506 A1 6/2009 Umeda et al.
2009/0152541 A1 6/2009 Maekawa et al.
2009/0278122 A1 11/2009 Hosono et al.
2009/0280600 A1 11/2009 Hosono et al.
2009/0283763 A1 11/2009 Park et al.
2010/0065844 A1 3/2010 Tokunaga
2010/0092800 A1 4/2010 Itagaki et al.
2010/0097838 A1 4/2010 Tanaka et al.
2010/0109002 A1 5/2010 Itagaki et al.
2010/0148171 A1 * 6/2010 Hayashi et al. ................. 257/43
2010/0193785 A1 8/2010 Kimura
2010/0213458 A1 * 8/2010 Prall .............................. 257/43
2011/0101351 A1 5/2011 Yamazaki
2011/0121878 A1 5/2011 Kato et al.
2011/0122673 A1 5/2011 Kamata et al.
2011/0128777 A1 6/2011 Yamazaki et al.
2011/0134683 A1 6/2011 Yamazaki et al.
2011/0147737 A1 6/2011 Yamazaki et al.
2011/0156025 A1 6/2011 Shionoiri et al.
2011/0156027 A1 6/2011 Yamazaki et al.
2011/0156028 A1 6/2011 Yamazaki et al.
2011/0156117 A1 6/2011 Yamazaki et al.

(56) References Cited

U.S. PATENT DOCUMENTS

| | | | |
|---|---|---|---|
| 2011/0157961 | A1 | 6/2011 | Yamazaki et al. |
| 2011/0175083 | A1 | 7/2011 | Sekine et al. |
| 2011/0175087 | A1 | 7/2011 | Yamazaki et al. |
| 2011/0175104 | A1 | 7/2011 | Yamazaki |
| 2011/0175646 | A1 | 7/2011 | Takemura et al. |
| 2011/0176263 | A1 | 7/2011 | Yamazaki et al. |
| 2011/0176348 | A1 | 7/2011 | Yamazaki et al. |
| 2011/0176355 | A1 | 7/2011 | Furutani et al. |
| 2011/0176377 | A1 | 7/2011 | Koyama |
| 2011/0182110 | A1 | 7/2011 | Yamazaki et al. |
| 2011/0186837 | A1 | 8/2011 | Takahashi et al. |
| 2011/0187410 | A1 | 8/2011 | Kato et al. |
| 2011/0194327 | A1 | 8/2011 | Kawae |
| 2011/0194332 | A1 | 8/2011 | Saito |
| 2012/0168748 | A1 | 7/2012 | Yano et al. |

FOREIGN PATENT DOCUMENTS

| | | | |
|---|---|---|---|
| CN | 101471133 | A | 7/2009 |
| EP | 0147151 | A | 7/1985 |
| EP | 0522539 | A | 1/1993 |
| EP | 0971416 | A | 1/2000 |
| EP | 1 737 044 | A1 | 12/2006 |
| EP | 2 226 847 | A2 | 9/2010 |
| EP | 2 339 639 | A2 | 6/2011 |
| JP | 57-105889 | A | 7/1982 |
| JP | 60-130160 | A | 7/1985 |
| JP | 60-198861 | A | 10/1985 |
| JP | 62-128091 | A | 6/1987 |
| JP | 62-274773 | A | 11/1987 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 63-268184 | A | 11/1988 |
| JP | 02-054572 | A | 2/1990 |
| JP | 05-021758 | A | 1/1993 |
| JP | 05-251705 | A | 9/1993 |
| JP | 07-099311 | A | 4/1995 |
| JP | 08-264794 | A | 10/1996 |
| JP | 08-330445 | A | 12/1996 |
| JP | 11-040772 | A | 2/1999 |
| JP | 11-505377 | A | 5/1999 |
| JP | 11-274420 | A | 10/1999 |
| JP | 2000-044236 | A | 2/2000 |
| JP | 2000-150900 | A | 5/2000 |
| JP | 2001-044297 | A | 2/2001 |
| JP | 2002-076356 | A | 3/2002 |
| JP | 2002-289859 | A | 10/2002 |
| JP | 2002-368226 | A | 12/2002 |
| JP | 2003-068883 | A | 3/2003 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-502597 | | 1/2006 |
| JP | 2007-042172 | A | 2/2007 |
| JP | 2007-103918 | A | 4/2007 |
| JP | 2008-103732 | A | 5/2008 |
| JP | 2008/117739 | | 10/2008 |
| JP | 2009-135350 | A | 6/2009 |
| JP | 2009164393 | A | 7/2009 |
| WO | WO-2004/038757 | | 5/2004 |
| WO | 2004/114391 | A1 | 12/2004 |
| WO | 2007/029844 | A1 | 3/2007 |
| WO | WO2009087943 | A1 | 7/2009 |

OTHER PUBLICATIONS

Kim, W et al., “An Experimental High-Density DRAM Cell with a Built-in Gain Stage,” IEEE Journal of Solid- State Circuits, Aug. 1, 1994, vol. 29, No. 8, pp. 978-981.

Shukuri, S et al., “A Complementary Gain Cell Technology for Sub-1 V Supply DRAMs,” IEDM 92: Technical Digest of International Electron Devices Meeting, Dec. 13, 1992, pp. 1006-1008.

Shukuri, S et al., “A Semi-Static Complementary Gain Cell Technology for Sub-1 V Supply DRAM’s,” IEEE Transactions on Electron Devices, Jun. 1, 1994, vol. 41, No. 6, pp. 926-931.

Na, J et al., “High Field-Effect Mobility Amorphous InGaZnO Transistors with Aluminum Electrodes,” Appl. Phys. Lett. (Applied Physics Letters), 2008, vol. 93, No. 6, pp. 063501-1-063501-3.

International Search Report, PCT Application No. PCT/JP2011/050787, dated Apr. 19, 2011, 2 pages.

Written Opinion, PCT Application No. PCT/JP2011/050787, dated Apr. 19, 2011, 4 pages.

Ohara, H et al., “Amorphous In—Ga—Zn—Oxide TFTs with Suppressed Variation for 4.0 inch QVGA AMOLED Display,” AM-FPD ’09 Digest 01- Technical Papers, Jul. 1, 2009, pp. 227-230, The Japan Society of Applied Physics.

Orita, M et al., “Amorphous transparent conducive mode InGaO3(ZnO)rn (m<4):a Zn4s conductor,” Philosophical Magazine, 2001, vol. 81, No. 5, pp. 501-515.

Orita, M et al., “Mechanism of Electrical Conductivity of Transparent InGaZnO4,”Phys. Rev. B (Physical Review. B), Jan. 15, 2000, vol. 61, No. 3, pp. 1811-1816.

Osada, T et al., “15.2: Development of Driver-Integrated Panel using Amorphous In—Ga—Zn—Oxide TFT,” SID Digest ’09 : SID International Symposium Digest of Technical Papers, May 31, 2009, pp. 184-187.

Osada, T et al., “Development of Driver-Integrated Panel Using Amorphous In—Ga—Zn—Oxide TFT,” AM-FPD ’09 Digest of Technical Papers, Jul. 1, 2009, pp. 36-36.

Park, J et al., “Dry etching of ZnO films and plasma-induced damage to optical properties,” J Vac. Sci. Technol. B (Journal of Vacuum Science & Technology B), Mar. 1, 2003, vol. 21, No. 2, pp. 800-803.

Park, J et al., “Improvements in the Device Characteristics of Amorphous Indium Gallium Zinc Oxide Thin-Film Transistors by Ar Plasma Treatment,”Appl. Phys. Lett. (Applied Physics Letters), Jun. 26, 2007, vol. 90, No. 26, pp. 262106-1-262106-3.

Park, J et al., “Electronic Transport Properties of Amorphous Indium—Gallium—Zinc Oxide Semiconductor Upon Exposure to Water,” Appl. Phys. Lett. (Applied Physics Letters), 2008, vol. 92, pp. 072104-1-072104-3.

Park, J et al, “High performance amorphous oxide thin film transistors with self-aligned top-gate structure,” IEDM 09: Technical Digest of International Electron Devices Meeting, Dec. 7, 2009, pp. 191-194.

Park, Sang-Hee et al., “42.3: Transparent ZnO Thin Film Transistor for the Application of High Aperture Ratio Bottom Emission AM-OLED Display,” SID Digest ’08 : SID International Symposium Digest of Technical Papers, May 20, 2008, vol. 39, pp. 629-632.

Park, J et al., “Amorphous Indium—Gallium—Zinc Oxide TFTs and Their Application for Large Size AMOLED,” AM-FPD ’08 Digest of Technical Papers, Jul. 2, 2008, pp. 275-278.

Park, S et al., “Challenge to Future Displays: Transparent AM-OLED Driven by PEALD Grown ZnO TFT,” IMID ’07 Digest, 2007, pp. 1249-1252.

Prins, M et al , “A Ferroelectric Transparent Thin-Film Transistor,” Appl. Phys. Lett. (Applied Physics Letters), Jun. 17, 1996, vol. 68, No. 25, pp. 3650-3652.

Sakata, J et al., “Development of 4.0-In. AMOLED Display With Driver Circuit Using Amorphous In—Ga—Zn—Oxide TFTs,” IDW ’09 : Proceedings of the 16th International Display Workshops, 2009, pp. 689-692.

Son, K et al., “42.4L: Late-News Paper: 4 Inch QVGA AMOLED Driven by the Threshold Voltage Controlled Amorphous GIZO (Ga2O3—In2O3—ZnO) TFT.” SID Digest ’08 : SID International. Symposium Digest of Technical Papers, May 20, 2008, vol. 39, pp. 633-636.

Takahashi, M et al., “Theoretical Analysis of IGZO Transparent Amorphous Oxide Semiconductor,” IDW ’08 : Proceedings of the 15th International Display Workshops, Dec. 3, 2008, pp. 1637-1640.

Tsuda. K et al., “Ultra Low Power Consumption Technologies for Mobile TFT-LCDs,”IDW ’02 : Proceedings of the 9th International Display Workshops, Dec. 4, 2002, pp. 295-298.

(56) References Cited

OTHER PUBLICATIONS

Ueno , K et al., "Held-Effect Transistor on SrTiO3 With Sputtered Al2O3 Gate Insulator" Appl. Phys. Lett. (Applied Physics Letters), Sep. 1, 2003, vol. 83, No. 9, pp. 1755-1757.
Van De Walle, C "Hydrogen as a Cause of Dop:ng in Zinc Oxide," Phys. Rev. Lett. (Physical Review Letters, Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, Ret al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "SPINEL,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.

(56) References Cited

OTHER PUBLICATIONS

Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film.Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Chinese Office Action (Application No. 201180008328.2) Dated Apr. 2, 2014.
Taiwanese Office Action (Application No. 100102124) Dated Sep. 1, 2015.

* cited by examiner

FIG. 7A
500
FIG. 7B
502
FIG. 7C
510
FIG. 7D
512
FIG. 7E
512
514
FIG. 7F
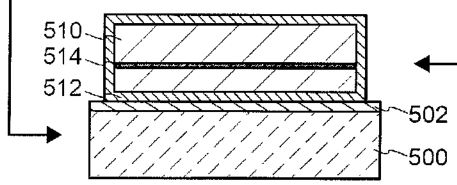
FIG. 7G
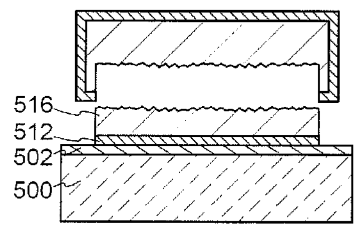
FIG. 7H
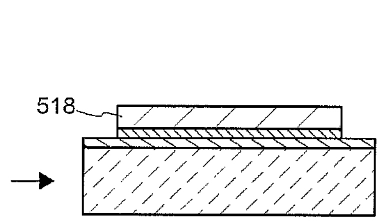

FIG. 11A
FIG. 11B
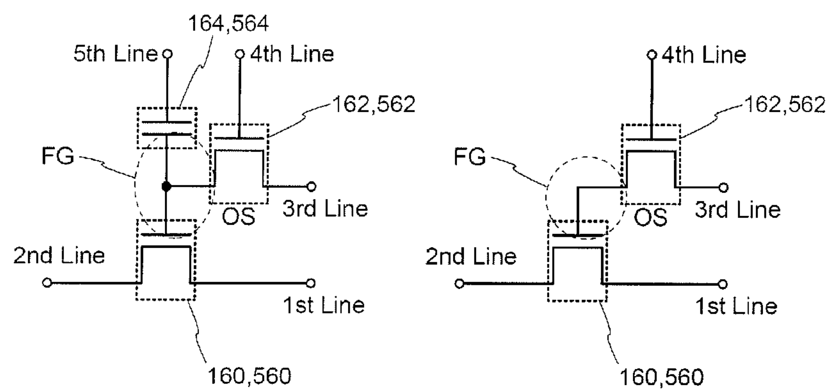
FIG. 11C
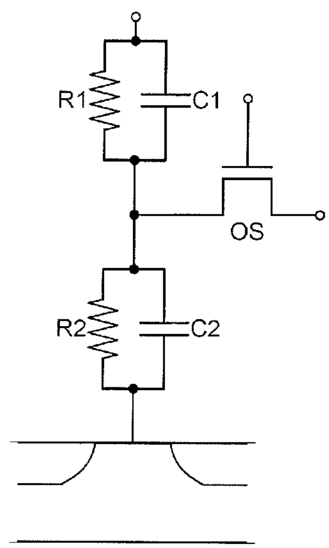

ID-VG characteristic (L/W=10μm/1m TFT)

SEMICONDUCTOR DEVICE

TECHNICAL FIELD

The disclosed invention relates to a semiconductor device in which a semiconductor element is used and a manufacturing method of the semiconductor device.

BACKGROUND ART

Memory devices including semiconductor elements are broadly classified into two categories: a volatile memory device that loses stored data when not powered, and a non-volatile memory device that holds stored data even when not powered.

A typical example of a volatile memory device is a dynamic random access memory (DRAM). A DRAM stores data in such a manner that a transistor included in a memory element is selected and charge is accumulated in a capacitor.

Owing to the above principle, charge in a capacitor is lost when data in a DRAM is read out; thus, another writing operation is needed every time data is read out. Moreover, a transistor included in a memory element has leakage current (off-state current) between a source and a drain in an off state and charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Thus, a flash memory has advantages in that the data holding period is extremely long (semi-permanent) and refresh operation which is needed in a volatile memory device is not needed (e.g., see Patent Document 1).

However, in a flash memory, there is a problem in that a memory element does not function after repeated writing operations because a gate insulating layer included in the memory element deteriorates due to tunneling current generated in the writing operations. In order to avoid this problem, a method in which the number of writing operations is equalized among the memory elements can be employed for example, but a complicated peripheral circuit is needed to realize this method. Moreover, even when such a method is employed, the fundamental problem of lifetime is not resolved. In other words, a flash memory is not suitable for applications in which data is frequently rewritten.

In addition, high voltage is needed for injecting charge to a floating gate or removing the charge, and a circuit therefor is required. Further, it takes a relatively long time to inject or remove charge, and it is not easy to increase the speed of writing and erasing data.

[Reference]

Patent Document 1: Japanese Published Patent Application No. S57-105889

DISCLOSURE OF INVENTION

In view of the foregoing problems, an object of one embodiment of the disclosed invention is to provide a semiconductor device with a novel structure in which stored data can be held even when power is not supplied and there is no limitation on the number of times of writing.

In the disclosed invention, a semiconductor device is manufactured with the use of a purified oxide semiconductor. A transistor manufactured with the use of a purified oxide semiconductor has extremely low leakage current; therefore, data can be stored for a long time.

According to one embodiment of the disclosed invention, for example, a wiring (also referred to as a bit line) for connecting one memory cell to another memory cell and a source electrode or a drain electrode of a first transistor are electrically connected to each other through a source electrode or a drain electrode of a second transistor. The above-described structure allows a reduction in the number of wirings in comparison with the case where the source electrode or the drain electrode in the first transistor and the source electrode or the drain electrode in the second transistor are connected to different wirings. Thus, the degree of integration of a semiconductor device can be increased.

According to one embodiment of the disclosed invention, for example, one of wirings (also referred to as source lines) for connecting one memory cell to another memory cell is electrically connected to all of source electrodes or drain electrodes of first transistors included in a plurality of memory cells (including at least memory cells connected to different bit lines), whereby the number of the source lines is made smaller than that of the bit lines. Accordingly, the number of the source lines can be sufficiently reduced. Thus, the degree of integration of a semiconductor device can be increased.

Specifically, structures described below can be employed, for example.

A semiconductor device according to one embodiment of the present invention includes a plurality of memory cells each including a first transistor and a second transistor. The first transistor includes a first channel formation region; a first gate insulating layer provided over the first channel formation region; a first gate electrode provided over the first gate insulating layer so as to overlap with the first channel formation region; and a first source electrode and a first drain electrode electrically connected to the first channel formation region. The second transistor includes a second channel formation region; a second source electrode and a second drain electrode electrically connected to the second channel formation region; a second gate electrode provided so as to overlap with the second channel formation region; and a second gate insulating layer provided between the second channel formation region and the second gate electrode. The first channel formation region and the second channel formation region include different semiconductor materials. The first transistor and the second transistor are provided so that at least part of the first transistor and part of the second transistor overlap with each other. A wiring for connecting one of the memory cells and another memory cell is electrically connected to one of the first source electrode and the first drain electrode through one of the second source electrode and the second drain electrode.

It is preferable that, in the above-described semiconductor device, a region in which one of the first source electrode and the first drain electrode and one of the second source electrode and the second drain electrode are in contact with each other overlap with a region in which the one of the second source electrode and the second drain electrode is in contact with the wiring for connecting the one of the memory cells and the another memory cell.

Further, it is preferable that, in the above-described semiconductor device, one of the second source electrode and the second drain electrode and one of the first source electrode and the first drain electrode are the same. In that case, it is more preferable that the region in which the one of the second source electrode and the second drain electrode is in contact with the one of the first source electrode and the first drain electrode overlap with the region in which the one of the second source electrode and the second drain electrode is in contact with the wiring for connecting the one of the memory cells and the another memory cell.

A semiconductor device according to another embodiment of the present invention includes m (m is an integer of 2 or more) signal lines; m word lines; n (n is an integer of 2 or more) bit lines; k (k is a natural number less than n) source lines; (m×n) memory cells arranged in matrix; a first driver circuit electrically connected to the bit lines; a second driver circuit electrically connected to the source lines; a third driver circuit electrically connected to the signal lines; and a fourth driver circuit electrically connected to the word lines. One of the memory cells includes a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region and the second channel formation region include different semiconductor materials. One of the second source electrode and the second drain electrode, one of electrodes of the capacitor, and the first gate electrode are electrically connected to one another. One of the source lines and the first source electrode are electrically connected to each other. One of the bit lines, the other of the second source electrode and the second drain electrode, and the first drain electrode are electrically connected to each other. One of the word lines and the other electrode of the capacitor are electrically connected to each other. One of the signal lines and the second gate electrode are electrically connected to each other. One of the source lines is electrically connected to all of the first source electrodes included in j (j is an integer number greater than or equal to (m+1) and less than or equal to (m×n)) memory cells including the one of the memory cells.

A semiconductor device according to another embodiment of the present invention includes m (m is an integer of 2 or more) signal lines; m word lines; n (n is an integer of 2 or more) bit lines; k (k is a natural number less than n) source lines; (m×n) memory cells arranged in matrix; a first driver circuit electrically connected to the bit line; a second driver circuit electrically connected to the source line; a third driver circuit electrically connected to the signal line; and a fourth driver circuit electrically connected to the word line. One of the memory cells includes a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region and the second channel formation region include different semiconductor materials. One of the second source electrode and the second drain electrode, one of electrodes of the capacitor, and the first gate electrode are electrically connected to one another. One of the source lines and the first source electrode are electrically connected to each other. One of the bit lines, the other of the second source electrode and the second drain electrode, and the first drain electrode are electrically connected to each other. One of the word lines and the other electrode of the capacitor are electrically connected to each other. One of the signal lines and the second gate electrode are electrically connected to each other. One of the source lines is electrically connected to all of the first source electrodes included in (m×n/k) memory cells including the one of the memory cells.

Further, it is preferable that, in the above-described semiconductor device, the first transistor include impurity regions provided so as to sandwich the first channel formation region.

Further, it is preferable that, in the above-described semiconductor device, the second channel formation region in the second transistor include an oxide semiconductor.

Note that, although the transistor is formed using an oxide semiconductor material in the above semiconductor devices, the disclosed invention is not limited thereto. A material with which off-state current characteristics equivalent to those of the oxide semiconductor material can be achieved, such as a wide-gap material like silicon carbide (more specifically, a semiconductor material with an energy gap Eg larger than 3 eV) may be used.

Note that in this specification, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are only used for convenience of description and can include the case where the relation of components is reversed, unless otherwise specified.

Further, in this specification, the term such as "electrode" or "line" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be held for a very long time by using the transistor. In other words, refresh operation becomes unnecessary or the frequency of the refresh operation can be extremely low, which leads to a sufficient reduction in power consumption. Moreover, stored data can be held for a long time even when power is not supplied.

Further, a semiconductor device according to one embodiment of the disclosed invention does not need high voltage for writing of data and has no problem of deterioration of elements. For example, since there is no need to perform injection of electrons to a floating gate and extraction of electrons from the floating gate which are needed in a conventional nonvolatile memory, deterioration of a gate insulating layer does not occur. In other words, one embodiment of the semiconductor device according to the present invention does not have a limit on the number of times of rewriting which is a problem in a conventional nonvolatile memory, and the reliability thereof is drastically improved. Furthermore, data is written by turning on and off the transistor, whereby high-speed operation can be easily achieved. Additionally, there is an advantage that operation for erasing data is not needed.

A transistor including a material which is not an oxide semiconductor can operate at a higher speed than a transistor including an oxide semiconductor; thus, when it is combined with a transistor including an oxide semiconductor, a semiconductor device can perform operation (e.g., data reading operation) at a sufficiently high speed. Further, with a transistor including a material which is not an oxide semiconductor, a variety of circuits (e.g., a logic circuit, a driver circuit, and the like) for which high-speed operation is required can be favorably achieved.

Thus, a semiconductor device having a novel feature can be achieved by being provided with both the transistor including a semiconductor material which is not an oxide semiconductor (a transistor capable of operation at a sufficiently high speed, in general) and the transistor including an oxide semiconductor (a transistor whose off-state current is sufficiently low, in general).

Furthermore, in one embodiment of the disclosed invention, a wiring is shared to reduce the number of wirings; thus, a semiconductor device with an increased degree of integration can be provided.

BRIEF DESCRIPTION OF DRAWINGS

FIGS. 7A to 7H are cross-sectional views illustrating manufacturing steps of a semiconductor substrate used for manufacturing a semiconductor device.

FIGS. 11A to 11C are circuit diagrams of a semiconductor device.

BEST MODE FOR CARRYING OUT THE INVENTION

Figure 1A:
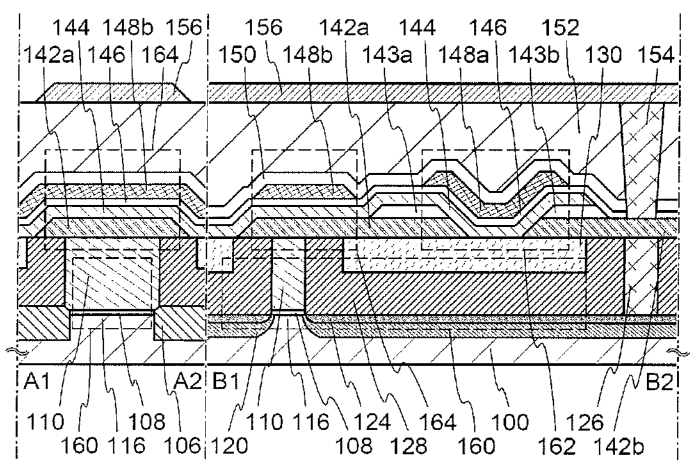
FIGS. 1A and 1B are a cross-sectional view and a plan view of a semiconductor device, respectively.

Hereinafter, embodiments and examples of the present invention will be described with reference to the drawings. Note that the present invention is not limited to the following description and it will be easily understood by those skilled in the art that modes and details can be modified in various ways without departing from the spirit and the scope of the present invention. Therefore, the invention should not be construed as being limited to the description in the following embodiment modes.

Note that the position, the size, the range, or the like of each structure illustrated in drawings is not accurately represented in some cases for easy understanding. Therefore, the present invention is not limited to the position, size, range and the like disclosed in the drawings.

In this specification and the like, ordinal numbers such as “first”, “second”, and “third” are used in order to avoid confusion among components, and the terms do not mean limitation of the number of components.

(Embodiment 1)

In this embodiment, a structure and a manufacturing method of a semiconductor device according to one embodiment of the disclosed invention will be described with reference to FIGS. 1A and 1B, FIGS. 2A to 2D, and FIGS. 3A to 3D, FIGS. 4A to 4D, and FIGS. 5A to 5C.

<Cross-Sectional Structure and Planar Structure of Semiconductor Device>

Figure 1B:
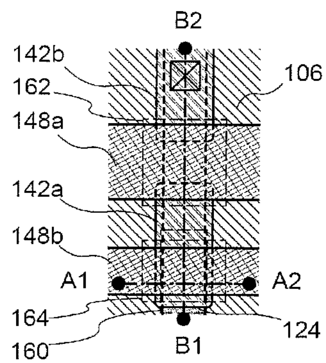

FIGS. 1A and 1B illustrate an example of a structure of a semiconductor device. FIG. 1A is a cross-sectional view of the semiconductor device, and FIG. 1B is a plan view thereof. Here, FIG. 1A corresponds to a cross section taken along line A1-A2 and line B1-B2 in FIG. 1B. The semiconductor device illustrated in FIGS. 1A and 1B includes a transistor 160 including a first semiconductor material in its lower portion, and a transistor 162 including a second semiconductor material in its upper portion. Here, it is preferable that the first semiconductor material and the second semiconductor material be different from each other. For example, the first semiconductor material can be a semiconductor material which is not an oxide semiconductor and the second semiconductor material can be an oxide semiconductor. The semiconductor material which is not an oxide semiconductor can be, for example, silicon, germanium, silicon germanium, silicon carbide, or gallium arsenide, and a single crystal semiconductor is preferably used. Further, an organic semiconductor material or the like may be used. A transistor including such a semiconductor material which is not an oxide semiconductor can easily operate at a high speed. In contrast, a transistor including an oxide semiconductor can hold charge for a long time owing to its characteristics.

Although both of the transistors are n-channel transistors, it is needless to say that p-channel transistors can be used. The technical feature of the disclosed invention lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The transistor 160 in FIGS. 1A and 1B includes a channel formation region 116 provided in a substrate 100 including a semiconductor material (e.g., silicon); impurity regions 120 provided so as to sandwich the channel formation region 116; a metal compound regions 124 in contact with the impurity regions 120; a gate insulating layer 108 provided over the channel formation region 116; and a gate electrode 110 provided over the gate insulating layer 108. Note that a transistor whose source electrode and drain electrode are not illustrated in a drawing may be referred to as a transistor for the sake of convenience. Further, in such a case, in description of connection of a transistor, a source region and a source electrode are collectively referred to as a "source electrode," and a drain region and a drain electrode are collectively referred to as a "drain electrode." In other words, in this specification, the term "source electrode" may include a source region and the term "drain electrode" may include a drain region.

An electrode 126 is connected to part of the metal compound region 124 of the transistor 160. Here, the electrode 126 functions as a source electrode or a drain electrode of the transistor 160. The substrate 100 is provided with an element isolation insulating layer 106 which surrounds the transistor 160. An insulating layer 128 and an insulating layer 130 are provided over the transistor 160. Note that it is preferable that the transistor 160 do not include sidewall insulating layers as illustrated in FIGS. 1A and 1B in order to increase the degree of integration. On the other hand, in the case where the characteristics of the transistor 160 have priority, sidewall insulating layers may be provided on side surfaces of the gate electrode 110, and the impurity regions 120 may each include a region with a different impurity concentration in a region overlapping with the sidewall insulating layer.

The transistor 162 illustrated in FIGS. 1A and 1B includes a source or drain electrode 142*a* and a source or drain electrode 142*b* which are provided over the insulating layer 130; an oxide semiconductor layer 144 which is electrically connected to the source or drain electrode 142*a* and the source or drain electrode 142*b*; a gate insulating layer 146 which covers the source or drain electrode 142*a*, the source or drain electrode 142*b*, and the oxide semiconductor layer 144; a gate electrode 148*a* which is provided over the gate insulating layer 146 so as to overlap with the oxide semiconductor layer 144; an insulating layer 143*a* which is provided in a region between the source or drain electrode 142*a* and the oxide semiconductor layer 144 and which overlaps with the gate electrode 148*a*; and an insulating layer 143*b* which is provided in a region between the source or drain electrode 142*b* and the oxide semiconductor layer 144 and which overlaps with the gate electrode 148*a*. Note that, although it is preferable to provide the insulating layer 143*a* and the insulating layer 143*b* in order to reduce the capacitance between the source or drain electrode and the gate electrode, the insulating layer 143*a* and the insulating layer 143*b* are not necessarily provided.

Here, it is preferable that the oxide semiconductor layer 144 be purified by sufficient removal of impurities such as hydrogen or sufficient supply of oxygen. Specifically, the concentration of hydrogen in the oxide semiconductor layer 144 is, for example, lower than or equal to $5\times10^{19}$ atoms/$cm^3$, preferably lower than or equal to $5\times10^{18}$ atoms/$cm^3$, more preferably lower than or equal to $5\times10^{17}$ atoms/$cm^3$. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer 144 is purified and defect states in the energy gap due to oxygen deficiency are reduced by sufficient supply of oxygen, the carrier concentration is lower than $1\times10^{12}/cm^3$, preferably lower than $1\times10^{11}/cm^3$, more preferably lower than $1.45\times10^{10}/cm^3$. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA. With the use of such an i-type (intrinsic) or substantially i-type oxide semiconductor, the transistor 162 which has highly excellent off-state current characteristics can be obtained.

Note that although the transistor 162 in FIGS. 1A and 1B includes the oxide semiconductor layer 144 which is processed into an island shape in order to suppress leakage current between elements which is caused due to miniaturization, the oxide semiconductor layer 144 which is not processed into an island shape may be employed. In the case where the oxide semiconductor layer is not processed into an island shape, contamination of the oxide semiconductor layer 144 caused by etching in the process step can be prevented.

A capacitor 164 in FIGS. 1A and 1B includes the source or drain electrode 142*a*, the oxide semiconductor layer 144, the gate insulating layer 146, and an electrode 148*b*. In other words, the source or drain electrode 142*a* functions as one electrode of the capacitor 164 and the electrode 148*b* functions as the other electrode of the capacitor 164.

Note that in the capacitor 164 illustrated in FIGS. 1A and 1B, the oxide semiconductor layer 144 and the gate insulating layer 146 are stacked, whereby insulation between the source or drain electrode 142*a* and the electrode 148*b* can be sufficiently secured. Needless to say, the oxide semiconductor layer 144 in the capacitor 164 may be omitted in order to secure sufficient capacitance. Alternatively, an insulating layer which is formed in the same manner as the insulating layer 143*a* may be included in the capacitor 164. Further alternatively, the capacitor 164 may be omitted in the case where a capacitor is not needed.

Note that in the transistor 162 and the capacitor 164, edge portions of the source or drain electrode 142*a* and the source or drain electrode 142*b* are preferably tapered. When the edge portions of the source or drain electrode 142*a* and the source or drain electrode 142*b* are tapered, the coverage with the oxide semiconductor layer 144 can be improved and breaking thereof can be prevented. Here, a taper angle is, for example, greater than or equal to 30° and less than or equal to 60°. Note that the "taper angle" is a tilt angle between a side surface and a bottom surface of a layer having a tapered shape (e.g., the source or drain electrode 142*a*) when the layer is seen in a direction perpendicular to a cross-sectional plane (a plane perpendicular to the surface of a substrate).

In this embodiment, the transistor 162 and the capacitor 164 are provided so as to overlap with the transistor 160. Such a planar layout allows an increase in the degree of integration. For example, when F is used to express the minimum feature size, the area of a memory cell can be expressed as 15 $F^2$ to 25 $F^2$.

An insulating layer 150 is provided over the transistor 162 and the capacitor 164 and an insulating layer 152 is provided over the insulating layer 150. An electrode 154 is provided in an opening formed in the gate insulating layer 146, the insulating layer 150, and the insulating layer 152. A wiring 156 connected to the electrode 154 is formed over the insulating layer 152. Note that, although in FIGS. 1A and 1B, the metal compound region 124, the source or drain electrode 142*b*, and the wiring 156 are connected to one another through the electrode 126 and the electrode 154, the disclosed invention is not limited thereto. For example, the source or drain electrode 142*b* may be directly in contact with the metal compound region 124. Alternatively, the wiring 156 may be directly in contact with the source or drain electrode 142*b*.

Note that in FIGS. 1A and 1B, the electrode 126 for connecting the metal compound region 124 to the source or drain electrode 142*b* and the electrode 154 for connecting the source or drain electrode 142*b* to the wiring 156 overlap with each other. In other words, a region in which the electrode 126 functioning as a source electrode or a drain electrode of the transistor 160 is in contact with the source or drain electrode 142*b* of the transistor 162 overlaps with a region in which the source or drain electrode 142*b* of the transistor 162 is in contact with the wiring 156 for connecting one memory cell to another memory cell. Such a layout allows an increase in the degree of integration.

<Manufacturing Method of Semiconductor Device>

Next, an example of a manufacturing method of the semiconductor device will be described. First, a manufacturing method of the transistor 160 in the lower portion will be described below with reference to FIGS. 2A to 2D and FIGS. 3A to 3D, and then a manufacturing method of the transistor 162 and the capacitor 164 in the upper portion will be described with reference to FIGS. 4A to 4D and FIGS. 5A to 5C.

<Manufacturing Method of Transistor in Lower Portion>

Figure 2A:
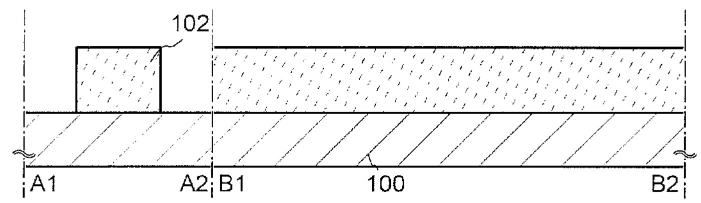
FIGS. 2A to 2D are cross-sectional views illustrating manufacturing steps of a semiconductor device.
Figure 2B:
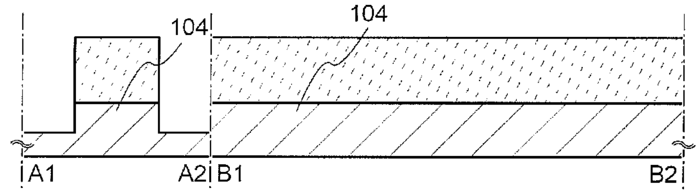

First, a substrate 100 including a semiconductor material is prepared (see FIG. 2A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon layer is provided on an insulating surface. In this specification, the term "SOI substrate" also means a substrate where a semiconductor layer including a material other than silicon is provided on an insulating surface. In other words, a semiconductor layer included in the "SOT substrate" is not limited to a silicon layer. Moreover, the SOI substrate can be a substrate having a structure in which a semiconductor layer is provided over an insulating substrate such as a glass substrate, with an insulating layer interposed therebetween.

A single crystal semiconductor substrate of silicon or the like is particularly preferably used as the substrate 100 including a semiconductor material, in which case the speed of reading operation of the semiconductor device can be increased.

A protective layer 102 serving as a mask for forming an element isolation insulating layer is formed over the substrate 100 (see FIG. 2A). As the protective layer 102, for example, an insulating layer formed using silicon oxide, silicon nitride, silicon oxynitride or the like can be used. Note that before or after this step, an impurity element imparting n-type conductivity or impurity elements imparting p-type conductivity may be added to the substrate 100 in order to control the threshold voltage of the transistor. In the case where silicon is included as the semiconductor material in the substrate 100, phosphorus, arsenic, or the like can be used as the impurity elements imparting n-type conductivity. In contrast, boron, aluminum, gallium, or the like can be used as the impurity elements imparting p-type conductivity.

Next, part of the substrate 100 in a region which is not covered with the protective layer 102 (i.e., in an exposed region) is removed by etching using the protective layer 102 as a mask. Thus, a semiconductor region 104 isolated from the other semiconductor regions is formed (see FIG. 2B). As the etching, dry etching is preferably performed, but wet etching may be performed. An etching gas and an etchant can be selected as appropriate depending on a material to be etched.

Figure 2C:
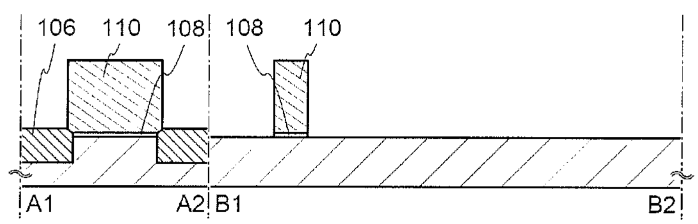

Next, an insulating layer is formed so as to cover the semiconductor region 104, and the insulating layer in a region overlapping with the semiconductor region 104 is selectively removed, whereby the element isolation insulating layers 106 are formed (see FIG. 2C). The insulating layer is formed using silicon oxide, silicon nitride, silicon oxynitride or the like. For removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layers 106.

Note that as a formation method of the element isolation insulating layer 106, a method in which an insulating region is formed by introduction of oxygen or the like can be used as well as a method in which an insulating layer is selectively removed.

Next, an insulating layer is formed on a surface of the semiconductor region 104, and a layer containing a conductive material is formed over the insulating layer.

The insulating layer later serves as a gate insulating layer and can be formed by, for example, performing heat treatment (e.g., thermal oxidation treatment, thermal nitridation treatment, or the like) on the surface of the semiconductor region 104. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed by a CVD method, a sputtering method, or the like. The insulating layer preferably has a single-layer structure or a stacked-layer structure including a film which contains any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the formation method of the layer containing a conductive material, and a variety of film formation methods such as an evaporation method, a CVD method, a sputtering method, or a spin coating method can be employed. Note that an example of the case where the layer containing a conductive material is formed using a metal material is described in this embodiment.

After that, the insulating layer and the layer containing a conductive material are selectively etched, whereby the gate insulating layer 108 and the gate electrode 110 are formed (see FIG. 2C).

Figure 2D:
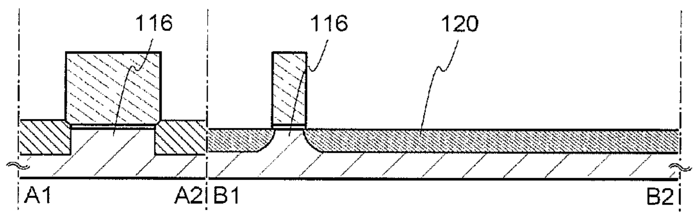

Next, phosphorus (P), arsenic (As), or the like is added to the semiconductor region 104, whereby the channel formation region 116 and the impurity regions 120 are formed (see FIG. 2D). Note that although phosphorus or arsenic is added here to manufacture an n-channel transistor, impurity elements such as boron (B) or aluminum (Al) may be added in the case of manufacturing a p-channel transistor. Here, the concentration of the impurities added can be set as appropriate; the concentration of the impurities added is preferably increased in the case where the semiconductor element is highly minimized.

Note that sidewall insulating layers may be formed in the periphery of the gate electrode 110 to form impurity regions to which impurity elements are added at different concentrations.

Figure 3A:
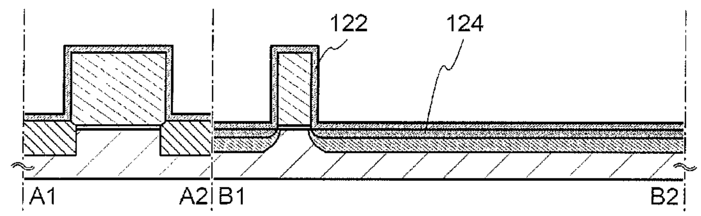
FIGS. 3A to 3D are cross-sectional views illustrating manufacturing steps of a semiconductor device.

Next, a metal layer 122 is formed so as to cover the gate electrode 110, the impurity regions 120, and the like (see FIG. 3A). A variety of film formation methods such as a vacuum evaporation method, a sputtering method, or a spin coating method can be employed for forming the metal layer 122. The metal layer 122 is preferably formed using a metal material that reacts with a semiconductor material contained in the semiconductor region 104 to be a low-resistance metal compound. Examples of such metal materials include titanium, tantalum, tungsten, nickel, cobalt, and platinum.

Next, heat treatment is performed, whereby the metal layer 122 reacts with the semiconductor material contained in the semiconductor region 104. Accordingly, the metal compound regions 124 which are in contact with the impurity regions 120 are formed (see FIG. 3A). Note that in the case where the gate electrode 110 is formed using polycrystalline silicon or the like, a metal compound region is also formed in a region of the gate electrode 110, which is in contact with the metal layer 122.

As the heat treatment, for example, irradiation with a flash lamp can be used. Although it is needless to say that another heat treatment method may be used, a method by which heat treatment for a very short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 3B:
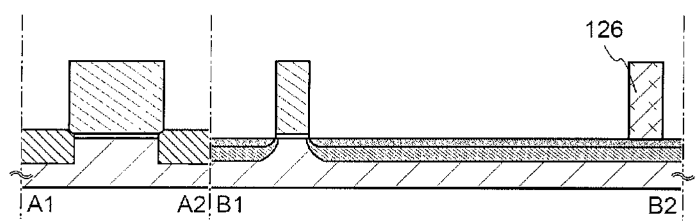

Next, the electrode 126 is formed in a region overlapping with part of the metal compound region 124 (see FIG. 3B). The electrode 126 can be formed in such a manner that, for example, a layer containing a conductive material is formed and then the layer containing a conductive material is selectively etched. The layer containing a conductive material can be formed using a metal material such as aluminum, copper, titanium, tantalum, or tungsten. The layer containing a conductive material may be formed using a semiconductor material such as polycrystalline silicon. There is no particular limitation on the formation method of the layer containing a conductive material, and a variety of film formation methods such as an evaporation method, a CVD method, a sputtering method, or a spin coating method can be used.

Note that the electrode 126 can be alternatively formed so as to fill an opening which is formed in the insulating layer 128 and the insulating layer 130 to reach the metal compound region 124 after the formation of the insulating layer 128 and the insulating layer 130.

In that case, it is possible to use a method, for example, in which a thin titanium film is formed in a region including the opening by a PVD method and a thin titanium nitride film is formed by a CVD method, and then a tungsten film is formed so as to fill the opening. Here, the titanium film formed by a PVD method has a function of reducing an oxide film (e.g., a natural oxide film) formed on a surface over which the titanium film is formed, and thereby lowering the contact resistance with the lower electrodes or the like (the metal compound regions 124, here). The titanium nitride film formed after the formation of the titanium film has a barrier function of preventing diffusion of the conductive material. A copper film can be formed by a plating method after the formation of a barrier film of titanium, titanium nitride, or the like.

Figure 3C:
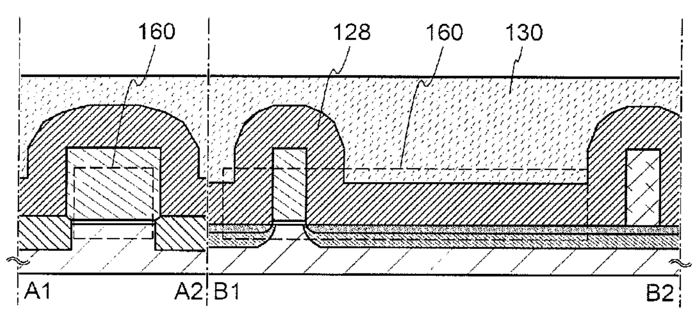

Next, the insulating layer 128 and the insulating layer 130 are formed so as to cover the components formed in the above steps (see FIG. 3C). The insulating layer 128 and the insulating layer 130 can be formed using a material including an inorganic insulating material such as silicon oxide, silicon oxynitride, silicon nitride, or aluminum oxide. The insulating layer 128 and the insulating layer 130 are particularly preferably formed using a low dielectric constant (low-k) material, in which case capacitance due to overlapping electrodes or wirings can be sufficiently reduced. Note that a porous insulating layer formed using such a material may be used as the insulating layer 128 and the insulating layer 130. A porous insulating layer has lower dielectric constant than an insulating layer with high density; thus, capacitance due to electrodes or wirings can be further reduced. Moreover, the insulating layer 128 and the insulating layer 130 can be formed using an organic insulating material such as polyimide or acrylic. Note that, although a stacked-layer structure of the insulating layer 128 and the insulating layer 130 is employed here, one embodiment of the disclosed invention is not limited thereto. A single-layer structure or a stacked-layer structure of two or more layers may also be used.

Through the above steps, the transistor 160 is manufactured with the use of the substrate 100 including a semiconductor material (see FIG. 3C). The transistor 160 manufactured in such a manner is capable of high-speed operation. Thus, when the transistor is used as a reading transistor, data can be read at a high speed.

Figure 3D:
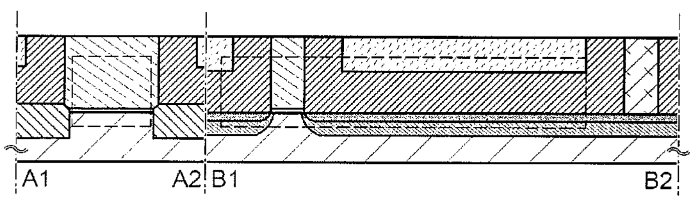

After that, CMP treatment is performed on the insulating layer 128 and the insulating layer 130 as treatment before the formation of the transistor 162 and the capacitor 164, whereby upper surfaces of the gate electrode 110 and the electrode 126 are exposed (see FIG. 3D). As the treatment for exposing the upper surfaces of the gate electrode 110 and the electrode 126, etching treatment or the like can be employed as an alternative to (or in combination with) CMP treatment. Note that it is preferable to planarize the surfaces of the insulating layer 128 and the insulating layer 130 as much as possible in order to improve the characteristics of the transistor 162.

Note that an electrode, a wiring, a semiconductor layer, an insulating layer may be further formed before and after the above steps. For example, a multilayer wiring structure in which an insulating layer and a conductive layer are stacked is employed as a wiring structure, whereby a highly-integrated semiconductor device can be achieved.

<Manufacturing Method of Transistor in Upper Portion>

Next, a conductive layer is formed over the gate electrode 110, the electrode 126, the insulating layer 128, the insulating layer 130, and the like, and then the conductive layer is selectively etched, whereby the source or drain electrode 142a is formed. The source or drain electrode 142b is formed so as to be electrically connected to the electrode 126 (see FIG. 4A).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, or scandium, or a material containing two or more of these in combination may be used.

The conductive layer may have a single-layer structure or a layered-layer structure including two or more layers. For example, a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that edge portions of the source or drain electrode 142a and the source or drain electrode 142b are tapered. Here, it is preferable that the tapered angle be, for example, greater than or equal to 30° and less than or equal to 60°. The source or drain electrode 142a and the source or drain electrode 142b are etched to have tapered edge portions; accordingly, the coverage with the gate insulating layer 146 which is to be formed later is improved and breaking thereof can be prevented.

The channel length (L) of the transistor in the upper portion is determined by the distance between a lower edge portion of the source or drain electrode 142a and a lower edge portion of the source or drain electrode 142b. Note that in light exposure for forming a mask for a transistor with a channel length (L) of less than 25 nm, it is preferable to use extreme ultraviolet rays whose wavelength is as short as several nanometers to several tens of nanometers. In the light exposure by extreme ultraviolet rays, the resolution is high and the focus depth is large. Accordingly, the channel length (L) of the transistor which is to be completed later can be greater than or equal to 10 nm and less than or equal to 1000 nm (1 μm), whereby the operation speed of a circuit can be increased. Moreover, miniaturization makes it possible to reduce power consumption of the semiconductor device.

Note that an insulating layer functioning as a base may be provided over the insulating layer 128 and the insulating layer 130. The insulating layer can be formed by a PVD method, a CVD method, or the like.

Figure 4A:
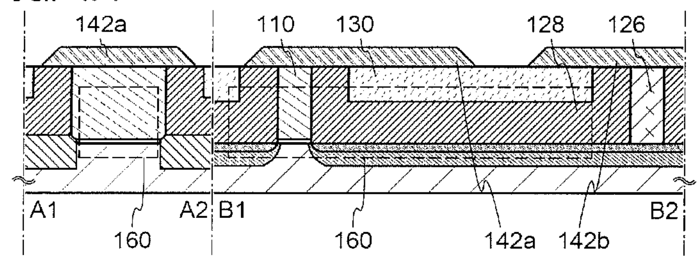
FIGS. 4A to 4D are cross-sectional views illustrating manufacturing steps of a semiconductor device.
Figure 4B:
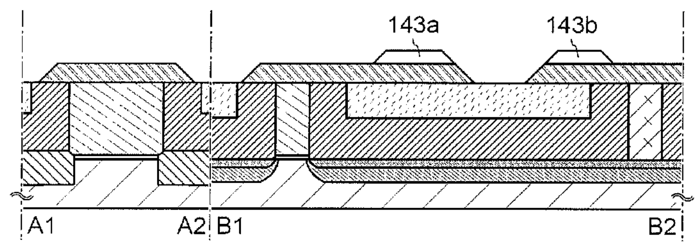

Next, the insulating layer 143a and the insulating layer 143b are formed over the source or drain electrode 142a and the source or drain electrode 142b, respectively (see FIG. 4B). The insulating layer 143a and the insulating layer 143b can be formed in such a manner that an insulating layer covering the source or drain electrode 142a and the source or drain electrode 142b is formed, and then the insulating layer is selectively etched. The insulating layer 143a and the insulating layer 143b are formed so as to overlap with part of a gate electrode which is to be formed later. When such an insulating layer is provided, the capacitance between the gate electrode and the source or drain electrode can be reduced.

The insulating layer 143a and the insulating layer 143b can be formed using a material including an inorganic insulating material such as silicon oxide, silicon oxynitride, silicon nitride, or aluminum oxide. The insulating layer 143a and the insulating layer 143b are particularly preferably formed using a low dielectric constant (low-k) material, in which case the capacitance between the gate electrode and the source or drain electrode can be sufficiently reduced. Note that a porous insulating layer formed using such a material may be used as the insulating layer 143a and the insulating layer 143b. A porous insulating layer has lower dielectric constant than an insulating layer with high density; thus, the capacitance between the gate electrode and the source or drain electrode can be further reduced.

The formation of the insulating layer 143a and the insulating layer 143b is preferable in terms of reducing the capacitance between the gate electrode and the source or drain electrode. However, a structure in which the insulating layers are not provided can be employed.

Figure 4C:
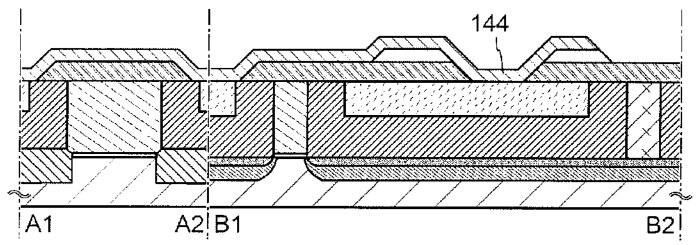
Figure 4D:
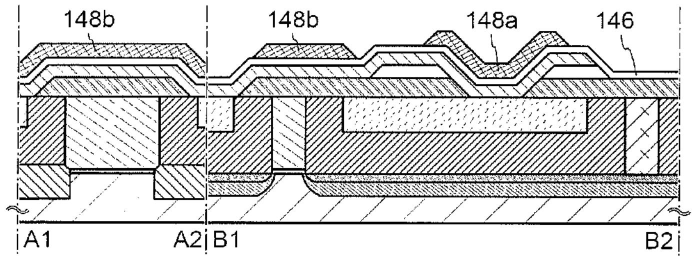

Next, an oxide semiconductor layer is formed so as to cover the source or drain electrode 142a and the source or drain electrode 142b, and then the oxide semiconductor layer is selectively etched, whereby the oxide semiconductor layer 144 is formed (see FIG. 4C).

The oxide semiconductor layer 144 can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; or an In—O-based material, a Sn—O-based material, a Zn—O-based material, or the like which are single-component metal oxides.

In particular, an In—Ga—Zn—O-based oxide semiconductor material has sufficiently high resistance when there is no electric field; thus off-state current can be sufficiently reduced. In addition, also having high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ ($m>0$) is given. Further, there is an oxide semiconductor material represented by $InMO_3(ZnO)_m$ ($m>0$) when M is used instead of Ga. Here, M denotes one or more of metal elements selected from gallium (Ga), aluminum (Al), iron (Fe), nickel (Ni), manganese (Mn), cobalt (Co) and the like. For example, Mean be Ga, Ga and Al, Ga and Fe, Ga and Ni, Ga and Mn, Ga and Co or the like. Note that the above compositions are derived from the crystal structures and are just examples.

As a target for forming the oxide semiconductor layer 144 by a sputtering method, a target with a composition ratio of In to Ga and Zn of 1:x:y (x is greater than or equal to 0 and y is greater than or equal to 0.5 and less than or equal to 5) is preferably used. For example, a target with a composition ratio of $In_2O_3$ to $Ga_2O_3$ and ZnO of 1:1:2 [molar ratio] (x=1, y=1), or the like can be used. Alternatively, a target with a composition ratio of $In_3O_3$ to $Ga_2O_3$ and ZnO of 1:1:1 [molar ratio] (x=1, y=0.5), a target with a composition ratio of $In_2O_3$ to $Ga_2O_3$ and ZnO of 1:1:4 [molar ratio] (x=1, y=2), or a target with a composition ratio of $In_2O_3$ to $Ga_2O_3$ and ZnO=1:0:2 [molar ratio] (x=0, y=1) can be used.

In this embodiment, the oxide semiconductor layer is formed by a sputtering method with the use of all In—Ga—Zn—O-based oxide semiconductor target for film formation.

It is preferable that a metal oxide semiconductor contained in the oxide semiconductor target for film formation has a relative density of 80% or more, preferably 95% or more, more preferably 99.9% or more. With the use of a target for forming all oxide semiconductor with high relative density, an oxide semiconductor layer with a dense structure can be formed.

The atmosphere in which the oxide semiconductor layer is formed is preferably a rare gas (typically argon) atmosphere, an oxygen atmosphere, or a mixed atmosphere of a rare gas (typically argon) and oxygen. Specifically, it is preferable to use, for example, an atmosphere of a high-purity gas from which impurities such as hydrogen, water, hydroxyl, or hydride have been removed so that the concentration thereof is reduced to 1 ppm or less (preferably the concentration is 10 ppb or less).

In the formation of the oxide semiconductor layer, for example, an object to be processed is held in a treatment chamber that is kept under reduced pressure and the object is heated so that the temperature of the object is higher than or equal to 100° C. and lower than 550° C., preferably higher than or equal to 200° C. and lower than or equal to 400° C. Alternatively, the temperature of the object in forming the oxide semiconductor layer may be room temperature (25° C.±10° C.). Then, moisture in the treatment chamber is removed, a sputtering gas from which hydrogen, water, and the like have been removed is introduced, and the above target is used, so that the oxide semiconductor layer 144 is formed. By forming the oxide semiconductor layer while heating the object, impurities in the oxide semiconductor layer can be reduced. In addition, damage of the oxide semiconductor layer due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. With the use of a cryopump or the like, hydrogen, water, and the like can be removed from the treatment chamber; thus, the concentration of impurities in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere of oxygen and argon. It is preferable that a pulsed direct-current (DC) power supply be used because powder substances (also referred to as particles or dust) can be reduced and a film thickness distribution can be decreased. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer having such a thickness, a short-channel effect which occurs along with miniaturization can be suppressed. Note that the appropriate thickness varies depending on the material for the oxide semiconductor, the usage of the semiconductor device, or the like, and thus the thickness can be selected as appropriate depending on the material, the usage, or the like.

Note that before the oxide semiconductor layer is formed by a sputtering method, reverse sputtering in which plasma is generated with an argon gas introduced is preferably performed, so that dust attached to a surface on which the oxide semiconductor layer is formed (e.g., a surface of the insulating layer 130) is removed. Here, the reverse sputtering refers to a method in which ions collide with a surface to be processed of the substrate in order to modify the surface may, in contrast to normal sputtering in which ions collide with a sputtering target. An example of a method for making ions collide with a surface to be processed is a method in which high-frequency voltage is applied to the surface in an argon atmosphere so that plasma is generated near an object. Note that a nitrogen atmosphere, a helium atmosphere, an oxygen atmosphere, or the like may be used instead of an argon atmosphere.

After that, heat treatment (first heat treatment) is preferably performed on the oxide semiconductor layer. By the first heat treatment, excessive hydrogen (including water and hydroxyl) in the oxide semiconductor layer can be removed, the structure of the oxide semiconductor layer can be improved, and defect states in the energy gap can be reduced. The temperature of the first heat treatment is, for example, higher than or equal to 300° C. and lower than 550° C., or higher than or equal to 400° C. and lower than or equal to 500° C.

The heat treatment can be performed in such a manner that, for example, an object to be heated is introduced into an electric furnace in which a resistance heating element or the like is used and heated in a nitrogen atmosphere at 450° C. for an hour. During the first heat treatment, the oxide semiconductor layer is not exposed to air to prevent the entry of water and hydrogen.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA treatment may be performed in which the object is put in a heated inert gas atmosphere and heated for several minutes, and then taken out of the inert gas atmosphere. The GRTA process enables high-temperature heat treatment in a short time. Moreover, the GRTA process can be employed even when the temperature exceeds the upper temperature limit of the object. Note that the inert gas may be switched to a gas containing oxygen during the process. This is because defect states in the energy gap due to oxygen vacancies can be reduced by performing the first heat treatment in an atmosphere containing oxygen.

Note that as the inert gas atmosphere, an atmosphere that contains nitrogen or a rare gas (e.g., helium, neon, argon, or the like) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, impurities are reduced by the first heat treatment so that the i-type (intrinsic) or substantially i-type oxide semiconductor layer is obtained. Accordingly, a transistor having highly excellent characteristics can be achieved.

The above heat treatment (first heat treatment) can also be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or more times.

The etching of the oxide semiconductor layer may be performed either before or after the above heat treatment. Although dry etching is preferable in terms of element miniaturization, wet etching may also be used. An etching gas and an etchant can be selected as appropriate depending on a material to be etched. Note that in the case where leakage in an element is not a problem, the oxide semiconductor layer does not have to be processed into an island-shaped oxide semiconductor layer.

Next, the gate insulating layer 146 which is to be in contact with the oxide semiconductor layer 144 is formed. After that, over the gate insulating layer 146, the gate electrode **148*a* is formed in a region overlapping with the oxide semiconductor layer 144 and the electrode 148*b* is formed in a region overlapping with the source or drain electrode 142*a* (see FIG. 4**D).

The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure. There is no particular limitation on the thickness of the gate insulating layer 146; however, in the case where a semiconductor device is miniaturized, the gate insulating layer 146 is preferably thin in order to secure the operation of the transistor. For example, in the case where silicon oxide is used, the thickness of the gate insulating layer 146 can greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. With the use of a high-k material for the gate insulating layer 146, the thickness of the gate insulating layer 146 can be increased to prevent gate leakage and at the same time electrical characteristics can be maintained. Note that the gate insulating layer 146 may have a stacked-layer structure of a film containing a high-k material and a film containing any one of silicon oxide, silicon nitride, silicon oxynitride, silicon nitride oxide, aluminum oxide, and the like.

After the gate insulating layer 146 is formed, second heat treatment is preferably performed in an inert gas atmosphere or an oxygen atmosphere. The temperature of the second heat treatment is higher than or equal to 200° C. and lower than or equal to 450° C., preferably higher than or equal to 250° C. and lower than or equal to 350° C. For example, the second heat treatment may be performed at 250° C. in a nitrogen atmosphere for 1 hour. The second heat treatment can reduce variation in the electrical characteristics of the transistor. Moreover, in the case where the gate insulating layer 146 contains oxygen, oxygen can be supplied to the oxide semiconductor layer 144 to fill oxygen vacancies in the oxide semiconductor layer 144, whereby an i-type (intrinsic) or substantially i-type oxide semiconductor layer can be formed.

Note that, although the second heat treatment is performed after the gate insulating layer 146 is formed in this embodiment, the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

At least one of the first heat treatment and the second heat treatment is employed as described above, whereby the oxide semiconductor layer 144 can be purified so that impurities that are not main components of the oxide semiconductor are prevented from being contained therein as much as possible.

The gate electrode **148*a* and the electrode 148*b* can be formed in such a manner that a conductive layer is formed over the gate insulating layer 146 and then is selectively etched. The conductive layer to be the gate electrode 148*a* and the electrode 148*b* can be formed by a PVD method typified by a sputtering method or a CVD method such as a plasma CVD method. The details are similar to those of the source or drain electrode 142*a*** and the like; therefore, the description thereof can be referred to.

Figure 5A:
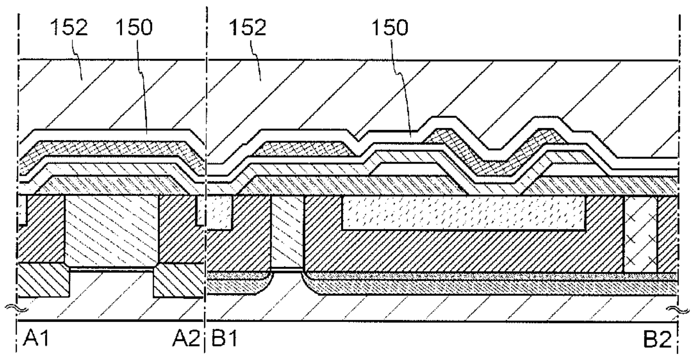
FIGS. 5A to 5C are cross-sectional views illustrating manufacturing steps of a semiconductor device.

Next, the insulating layer 150 and the insulating layer 152 are formed over the gate insulating layer 146, the gate electrode **148*a*, and the electrode 148*b* (see FIG. 5A). The insulating layer 150 and the insulating layer 152 can be formed by a PVD method, a CVD method, or the like. The insulating layer 150 and the insulating layer 152** can be formed using a material including an inorganic insulating material such as silicon oxide, silicon oxynitride, silicon nitride, hafnium oxide, or aluminum oxide.

Note that the insulating layer 150 and the insulating layer 152 are preferably formed using a low dielectric constant material or to have a structure with low dielectric constant (e.g., a porous structure). The dielectric constant of the insulating layer 150 and the insulating layer 152 is reduced, whereby the capacitance generated between wirings or electrodes can be reduced, which results in higher speed operation.

Note that, although a stacked-layer structure of the insulating layer 150 and the insulating layer 152 is employed in this embodiment, one embodiment of the disclosed invention is not limited thereto. A single-layer structure or a stacked-layer structure of two or more layers may also be used. Alternatively, the insulating layer may be omitted.

Note that the insulating layer 152 is preferably formed so as to have a planarized surface. By forming the interlayer insulating layer 152 having a planarized surface, an electrode, a wiring, or the like can be favorably formed over the interlayer insulating layer 152 even in the case where the semiconductor device is miniaturized, for example. The interlayer insulating layer 152 can be planarized by a method such as chemical mechanical polishing (CMP).

Figure 5B:
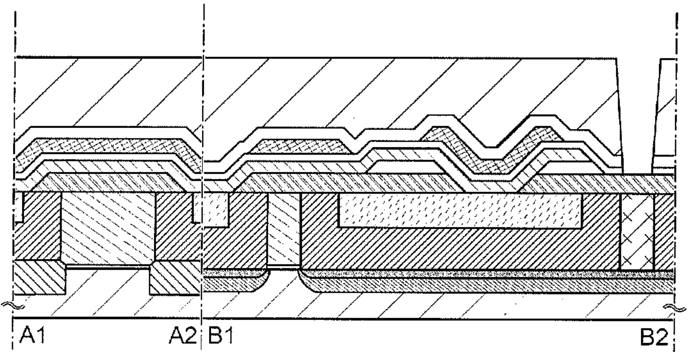

Next, an opening reaching the source or drain electrode 142*b* is formed in the gate insulating layer 146, the insulating layer 150, and the insulating layer 152 (see FIG. 5B). The opening is formed by selective etching using a mask or the like.

Here, the opening is preferably formed in a region overlapping with the electrode 126. The opening is formed in such a region, whereby an increase in the element area due to a contact region of electrodes can be suppressed. In other words, the degree of integration of the semiconductor device can be increased.

Figure 5C:
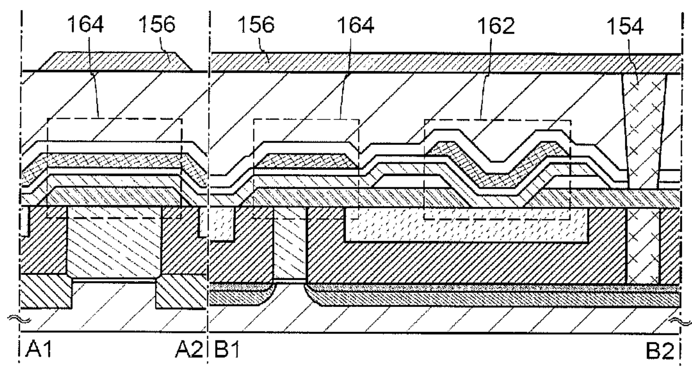

After that, the electrode 154 is formed in the opening, and the wiring 156 which is to be in contact with the electrode 154 is formed over the insulating layer 152 (see FIG. 5C).

The electrode 154 can be formed in such a manner that, for example, a conductive layer is formed by a PVD method, a CVD method, or the like in a region including the opening and then part of the conductive layer is removed by etching treatment, CMP, or the like.

Specifically, it is possible to employ a method in which, for example, a thin titanium film is formed by a PVD method in a region including the opening, a thin titanium nitride film is formed by a CVD method, and then a tungsten film is formed so as to fill the opening. Here, the titanium film formed by a PVD method has a function of reducing an oxide film (e.g., a natural oxide film) formed on a surface over which the titanium film is formed, to decrease the contact resistance with the lower electrode or the like (here, the source or drain electrode 142*b*). The titanium nitride film formed after the formation of the titanium film has a barrier function of preventing diffusion of the conductive material. A copper film may be formed by a plating method after a barrier film of titanium, titanium nitride, or the like is formed.

Note that in the case where the electrode 154 is formed by removing part of the conductive layer, processing is preferably performed so that the surface is planarized. For example, in the case where a thin titanium film or a thin titanium nitride film is formed in a region including the opening and then a tungsten film is formed so as to fill the opening, unnecessary portions of the tungsten film, the titanium film, the titanium nitride film, or the like can be removed and at the same time the planarity of the surface can be increased by subsequent CMP treatment. The surface including the electrode 154 is planarized in such a manner, whereby an electrode, a wiring, an insulating layer, a semiconductor layer, and the like can be favorably formed in later steps.

The wiring 156 is formed in such a manner that a conductive layer is formed by a PVD method such as a sputtering method or a CVD method such as a plasma CVD method, and then the conductive layer is patterned. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, or scandium, or a material containing two or more of these in combination may be used. The details are similar to those of the source or drain electrode 142*a* or the like.

Through the above steps, the transistor 162 and the capacitor 164 including the purified oxide semiconductor layer 144 is completed (see FIG. 5C).

Since the oxide semiconductor layer 144 is purified in the transistor 162 illustrated in this embodiment, the hydrogen concentration thereof is lower than $5\times10^{19}$ atoms/cm$^3$, preferably lower than $5\times10^{18}$ atoms/cm$^3$, more preferably lower than $5\times10^{17}$ atoms/cm$^3$. Moreover, the carrier density (e.g., less than $1\times10^{12}$/cm$^3$, more preferably less than $1.45\times10^{11}$/cm$^3$) of the oxide semiconductor layer 144 is much lower than that (approximately $1\times10^{14}$/cm$^3$) of a typical silicon wafer (a silicon wafer to which a small amount of impurity element such as phosphorus or boron is added). Accordingly, the off-state current of the transistor 162 is sufficiently small. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA.

With the use of the purified intrinsic oxide semiconductor layer 144, the off-state current of the transistor can be sufficiently reduced. Further, with the use of such a transistor, a semiconductor device capable of holding stored data for a very long time can be obtained.

The electrode 126 and the electrode 154 are formed so as to overlap with each other, whereby an increase in the element area due to a contact region of electrodes can be suppressed; thus, the degree of integration can be further increased. In addition, in the semiconductor device described in this embodiment, a wiring can be shared; thus, a semiconductor device with sufficiently increased degree of integration can be achieved.

The structures, methods, and the like described in this embodiment can be combined as appropriate with any of the structures, methods, and the like described in the other embodiments.

(Embodiment 2)

In this embodiment, a structure and a manufacturing method of a semiconductor device according to another embodiment of the disclosed invention will be described with reference to FIGS. 6A and 6B, FIGS. 7A to 7H, and FIGS. 8A to 8E.

<Cross-sectional Structure and Planar Structure of Semiconductor Device>

Figure 6A:
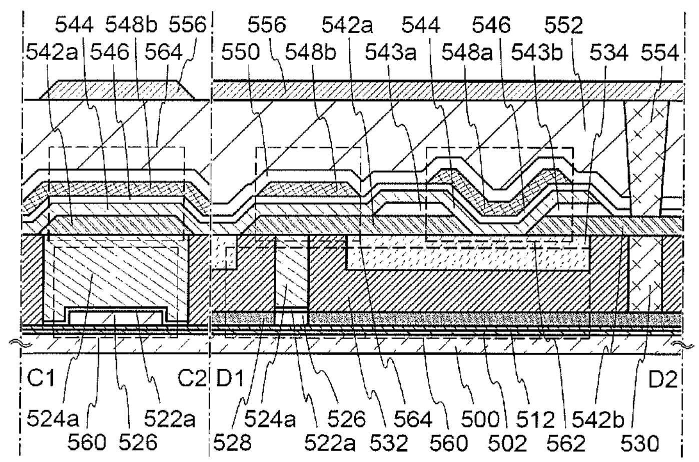
FIGS. 6A and 6B are a cross-sectional view and a plan view of a semiconductor device, respectively.
Figure 6B:
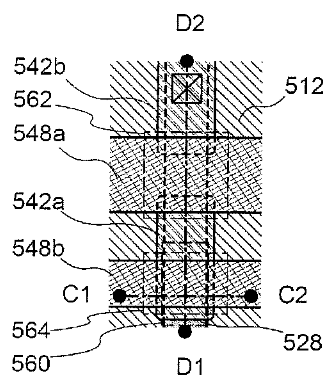

FIGS. 6A and 6B illustrate an example of a structure of a semiconductor device according to this embodiment. FIG. 6A is a cross-sectional view of the semiconductor device. FIG. 6B is a plan view of the semiconductor device. Here, FIG. 6A corresponds to a cross section taken along line C1-C2 and line D1-D2 in FIG. 6B. The semiconductor device illustrated in FIGS. 6A and 6B includes a transistor 560 including a first semiconductor material in its lower portion and a transistor 562 including a second semiconductor material in its upper portion. Here, it is preferable that the first semiconductor material and the second semiconductor material be different from each other. For example, the first semiconductor material can be a material (e.g., silicon) which is not an oxide semiconductor and the second semiconductor material can be an oxide semiconductor. A transistor including a semiconductor material which is not an oxide semiconductor can easily operate at a high speed. In contrast, a transistor including an oxide semiconductor can hold electric charge for a long time owing to its characteristics.

Although both of the transistors are n-channel transistors here, it is needless to say that p-channel transistors can be used. The technical feature of the disclosed invention lies in the use of a material with which off-state current can be sufficiently reduced, such as an oxide semiconductor, in the transistor 562 in order to hold data. Therefore, it is not necessary to limit specific conditions, such as a material, a structure, or the like of the semiconductor device, to those given here.

The transistor 560 illustrated in FIGS. 6A and 6B includes a channel formation region 526 provided in a semiconductor layer over a base substrate 500; impurity regions 528 provided so as to sandwich the channel formation region 526; a gate insulating layer 522*a* provided over the channel formation region 526; and a gate electrode 524*a* provided over the gate insulating layer 522*a*. In other words, one of the differences between the transistor 560 illustrated in FIGS. 6A and 6B and the transistor 160 illustrated in FIGS. 1A and 1B is whether or not the channel formation region is formed in the semiconductor layer over the base substrate 500. It can also be said that the difference lies in the use of a semiconductor substrate or an SOI substrate. Note that a transistor whose source electrode and drain electrode are not illustrated in a drawing may be referred to as a transistor for the sake of convenience.

An electrode 530 is connected to part of the impurity region 528 in the transistor. Here, the electrode 530 functions as a source electrode or a drain electrode of the transistor 560. An insulating layer 532 and an insulating layer 534 are provided so as to cover the transistor 560. Note that it is preferable that the transistor 560 do not include sidewall insulating layers as illustrated in FIGS. 6A and 6B in order to increase the degree of integration. On the other hand, in the case where the characteristics of the transistor 560 have priority, sidewall insulating layers may be provided on side surfaces of a gate electrode 524*a*, and the impurity regions 528 may each include a region with a different impurity concentration in a region overlapping with the sidewall insulating layer.

The transistor 562 in FIGS. 6A and 6B is the same as the transistor 162 in FIGS. 1A and 1B. In other words, the transistor 562 in FIGS. 6A and 6B includes a source or drain electrode 542*a* and a source or drain electrode 542*b* which are provided over the insulating layer 534; an oxide semiconductor layer 544 which is electrically connected to the source or drain electrode 542*a* and the source or drain electrode 542*b*; a gate insulating layer 546 which covers the source or drain electrode 542*a*, the source or drain electrode 542*b*, and the oxide semiconductor layer 544; a gate electrode 548*a* which is provided over the gate insulating layer 546 so as to overlap with the oxide semiconductor layer 544; an insulating layer 543*a* which is provided in a region between the source or drain electrode 542*a* and the oxide semiconductor layer 544, which overlaps with the gate electrode 548*a*; and an insulating layer 543*b* which is provided in a region between the source or drain electrode 542*b* and the oxide semiconductor layer 544, which overlaps with the gate electrode 548*a*. Note that, although it is preferable to provide the insulating layer 543*a* and the insulating layer 543*b* in order to reduce the capacitance between the source or drain electrode and the gate electrode, the insulating layer 543*a* and the insulating layer 543*b* are not necessarily provided. The above embodiment can be referred to for the other details.

Further, a capacitor 564 in FIGS. 6A and 6B is the same as the capacitor 164 in FIGS. 1A and 1B. In other words, the capacitor 564 in FIGS. 6A and 6B includes the source or drain electrode 542*a*, the oxide semiconductor layer 544, the gate insulating layer 546, and an electrode 548*b*. That is to say, the source or drain electrode 542*a* functions as one of electrodes of the capacitor 564, and the electrode 548*b* functions as the other electrode of the capacitor 564. The above embodiment can be referred to for the other details.

FIG. 6A is the same as FIG. 1A in this respect: an insulating layer 550 is provided over the transistor 562 and the capacitor 564; an insulating layer 552 is provided over the insulating layer 550; an electrode 554 is provided in an opening formed in the gate insulating layer 546, the insulating layer 550, and the insulating layer 552; and a wiring 556 is provided over the insulating layer 552 so as to be connected to the electrode 554.

<Manufacturing Method of SOI Substrate>

Next, an example of a manufacturing method of an SOI substrate used for manufacturing the above-described semiconductor devices will be described with reference to FIGS. 7A to 7H.

First, the base substrate 500 is prepared (see FIG. 7A). As the base substrate 500, a substrate formed of an insulator can be used. As specific examples thereof, the following are given: a variety of glass substrates used in the electronics industry, such as substrates made of aluminosilicate glass, aluminoborosilicate glass, and barium borosilicate glass; a quartz substrate; a ceramic substrate; and a sapphire substrate. Alternatively, a ceramic substrate which contains silicon nitride and aluminum nitride as main components and whose coefficient of thermal expansion is close to that of silicon may be used.

Alternatively, a semiconductor substrate such as a single crystal silicon substrate or a single crystal germanium substrate may be used as the base substrate 500. In the case of using such a semiconductor substrate as the base substrate 500, the upper limit of the temperature of heat treatment can be raised as compared with the case of using a glass substrate or the like, which allows a high-quality SOI substrate to be easily obtained. Here, as a semiconductor substrate, a solar grade silicon (SOG-Si) substrate or the like may be used. Alternatively, a polycrystalline semiconductor substrate may be used. When a solar grade silicon substrate, a polycrystalline semiconductor substrate, or the like is used, manufacturing cost can be reduced as compared with the case of using a single crystal silicon substrate or the like.

In this embodiment, the case where a glass substrate is used as the base substrate 500 is described. Cost reduction can be achieved when a glass substrate which can be increased in size and is inexpensive is used as the base substrate 500.

A surface of the base substrate 500 is preferably cleaned in advance. Specifically, the base substrate 500 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, the surface planarity of the base substrate 500 can be improved and abrasive particles left on the surface of the base substrate 500 can be removed.

Next, a nitrogen-containing layer 502 (e.g., a layer including an insulating film containing nitrogen, such as a silicon nitride ($SiN_x$) film or a silicon nitride oxide ($SiN_xO_y$ (x>y)) film) is formed over the surface of the base substrate 500 (see FIG. 7B). The nitrogen-containing layer 502 can be formed by a CVD method, a sputtering method, or the like.

The nitrogen-containing layer 502 formed in this embodiment serves as a layer for bonding a single crystal semiconductor layer (i.e., a bonding layer). The nitrogen-containing layer 502 also functions as a barrier layer for preventing impurities contained in the base substrate, such as sodium (Na), from diffusing into the single crystal semiconductor layer.

As described above, since the nitrogen-containing layer 502 is used as the bonding layer in this embodiment, it is preferable that the nitrogen-containing layer 502 be formed to have a certain level of surface planarity. Specifically, the nitrogen-containing layer 502 is formed such that it has an average surface roughness ($R_a$, which is also referred to as arithmetic mean deviation) of 0.5 nm or less and a root-mean-square surface roughness ($R_{ms}$) of 0.60 nm or less, preferably an average surface roughness of 0.35 nm or less and a root-mean-square surface roughness of 0.45 nm or less. Note that for the above average surface roughness and root-mean-square surface roughness, for example, a value obtained by the measurement performed on a region of 10 μm×10 μm can be used. The thickness is in the range of from 10 nm to 200 nm, preferably from 50 nm to 100 nm. With such a high degree of surface planarity, defective bonding of the single crystal semiconductor layer can be prevented.

Next, a bond substrate is prepared. Here, a single crystal semiconductor substrate 510 is used as the bond substrate (see FIG. 7C). Note that, although a single crystal substrate is used as the bond substrate here, the bond substrate is not necessarily limited to the single crystal substrate.

As the single crystal semiconductor substrate 510, for example, a single crystal semiconductor substrate formed using an element of Group 14, such as a single crystal silicon substrate, a single crystal germanium substrate, or a single crystal silicon germanium substrate, can be used. Alternatively, a compound semiconductor substrate formed using gallium arsenide, indium phosphide, or the like can be used. Commercial silicon substrates are typically circular in shape with diameters of 5 inches (approximately 125 mm), 6 inches (approximately 150 mm), 8 inches (approximately 200 mm), 12 inches (approximately 300 mm), and 16 inches (approximately 400 mm). Note that the shape of the single crystal semiconductor substrate 510 is not limited to the circular shape, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

An oxide film 512 is formed on a surface of the single crystal semiconductor substrate 510 (see FIG. 7D). In view of removal of contaminants, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like before the formation of the oxide film 512. Alternatively, dilute hydrofluoric acid and ozone water may be discharged alternately for cleaning.

The oxide film 512 can be formed to have a single-layer structure or a stacked-layer structure using, for example, a silicon oxide film, a silicon oxynitride film, and the like. As a method for forming the oxide film 512, a thermal oxidation method, a CVD method, a sputtering method, or the like can be used. In the case where the oxide film 512 is formed by a CVD method, a silicon oxide film is preferably formed using organosilane such as tetraethoxysilane (abbreviation: TEOS) (chemical formula: $Si(OC_2H_5)_4$) so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In that case, the oxide film 512 is a film containing chlorine atoms. By such chlorine oxidation, heavy metal (e.g., Fe, Cr, Ni, Mo, or the like) that is an extrinsic impurity is trapped and chloride of the metal is formed and then removed to the outside; thus, contamination of the single crystal semiconductor substrate 510 can be reduced. Moreover, after the base substrate 500 and the single crystal semiconductor substrate 510 are bonded to each other, impurities from the base substrate, such as Na, are fixed, so that contamination of the single crystal semiconductor substrate 510 can be prevented.

Note that the halogen atoms contained in the oxide film 512 are not limited to chlorine atoms. A fluorine atom may be contained in the oxide film 512. As a method of fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field and the single crystal semiconductor substrate 510 is irradiated with the ions and the ions are added to the single crystal semiconductor substrate 510, whereby an embrittled region 514 where the crystal structure is damaged is formed in the single crystal semiconductor substrate 510 at a predetermined depth (see FIG. 7E).

The depth at which the embrittled region 514 is formed can be controlled by the kinetic energy, mass, electric charge, incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be controlled with the depth at which the ions are added. For example, the average penetration depth may be adjusted such that the thickness of a single crystal semiconductor layer is approximately greater than or equal to 10 nm and less than or equal to 500 nm, preferably greater than or equal to 50 nm and less than or equal to 200 nm.

The above ion irradiation treatment can be performed with an ion doping apparatus or an ion implantation apparatus. As a typical example of the ion doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass separation apparatus. In the ion implantation apparatus, mass separation of ion species of plasma is performed and the object to be processed is irradiated with ion species having predetermined masses.

In this embodiment, an example will be described in which an ion doping apparatus is used for adding hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3$+, the efficiency of on irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium at the same time with an ion doping apparatus, the number of steps can be reduced as compared with the case of performing irradiation of hydrogen and helium in different steps, and increase in surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the base substrate 500 and the single crystal semiconductor substrate 510 are disposed to face each other, and the surface of the nitrogen-containing layer 502 and the oxide film 512 are firmly attached to each other. Thus, the base substrate 500 and the single crystal semiconductor substrate 510 can be bonded to each other (see FIG. 7F).

When bonding is performed, it is preferable that pressure greater than or equal to 0.001 $N/cm^2$ and less than or equal to 100 $N/cm^2$, e.g., pressure greater than or equal to 1 $N/cm^2$ and less than or equal to 20 $N/cm^2$, be applied to one portion of the base substrate 500 or one portion of the single crystal semiconductor substrate 510. When the bonding surfaces are made close to each other and firmly attached to each other by applying a pressure, a bonding between the nitrogen-containing layer 502 and the oxide film 512 is generated at the part where they are firmly attached to each other, and the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, surfaces to be bonded to are preferably subjected to surface treatment. Surface treatment can improve the bonding strength at the interface between the single crystal semiconductor substrate 510 and the base substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after the bonding. This heat treatment is performed at a temperature at which separation at the embrittled region 514 does not occur (for example, temperatures higher than or equal to room temperature and lower than 400° C.). Alternatively, the bonding of the nitrogen-containing layer 502 and the oxide film 512 may be performed while heating them at temperatures in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the disclosed invention should not be construed as being limited to this example.

Next, heat treatment is performed for separation of the single crystal semiconductor substrate 510 at the embrittled region, whereby a single crystal semiconductor layer 516 is formed over the base substrate 500 with the nitrogen-containing layer 502 and the oxide film 512 interposed therebetween (see FIG. 7G).

Note that it is preferable that the temperature for heat treatment in the separation be as low as possible. That is because the lower the temperature of the heat treatment at the time of the separation, the more surface roughness of the single crystal semiconductor layer 516 can be prevented. Specifically, the temperature of the heat treatment at the time of the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at 500° C. or higher so that the concentration of hydrogen remaining in the single crystal semiconductor layer 516 is reduced.

Next, the surface of the single crystal semiconductor layer 516 is irradiated with laser light, whereby a single crystal semiconductor layer 518 whose surface planarity is improved and in which defects is reduced are formed (see FIG. 7H). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the disclosed invention is not construed as being limited to this. The laser light irradiation treatment may be performed after the heat treatment for splitting the single crystal semiconductor layer 516 and etching treatment for removing a region including many defects at the surface of the single crystal semiconductor layer 516 are performed in this order. Alternatively, the laser light irradiation treatment may be performed after the surface planarity of the single crystal semiconductor layer 516 is improved. Note that the etching treatment may be either wet etching or dry etching. Further, after the irradiation with laser light is performed as described above, a step of reducing the thickness of the single crystal semiconductor layer 516 may be performed. In order to reduce the thickness of the single crystal semiconductor layer 516, either or both of dry etching and wet etching may be employed.

Through the above steps, an SOI substrate including the single crystal semiconductor layer 518 with favorable characteristics can be obtained (see FIG. 7H).

<Manufacturing Method of Semiconductor Device>

Next, a manufacturing method of a semiconductor device, particularly, the transistor 560, using the above SOI substrate will be described with reference to FIGS. 8A to 8E. Note that FIGS. 8A to 8E illustrate a manufacturing method of a semiconductor device using part of the SOI substrate formed by the method described with reference to FIGS. 7A to 7H.

Figure 8A:
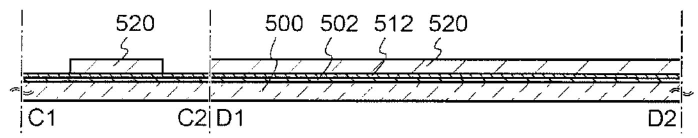
FIGS. 8A to 8E are cross-sectional views illustrating manufacturing steps of a semiconductor device.

First, the single crystal semiconductor layer 518 is processed into an island shape, so that a semiconductor layer 520 is formed (see FIG. 8A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as the impurity element imparting n-type conductivity. On the other hand, boron, aluminum, gallium, or the like can be used as the impurity element imparting p-type conductivity.

Figure 8B:
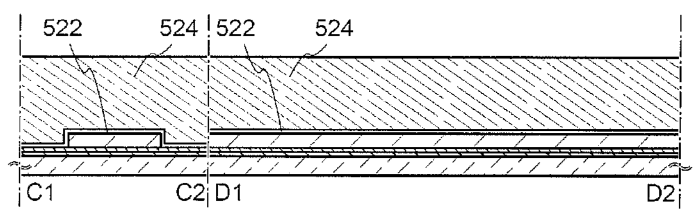

Next, an insulating layer 522 is formed so as to cover the semiconductor layer 520, and a conductive layer 524 is formed over the insulating layer 522 in a region overlapping with at least the semiconductor layer 520 (see FIG. 8B).

The insulating layer 522 is to be a gate insulating layer later. For example, the insulating layer 522 can be formed by performing heat treatment (e.g., thermal oxidation treatment, thermal nitridation treatment, or the like) on a surface of the semiconductor layer 520. High-density plasma treatment may be performed instead of the heat treatment. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by a CVD method, a sputtering method, or the like. The insulating layer preferably has a single-layer structure or a stacked-layer structure using a film containing any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like formed by a CVD method, a sputtering method, or the like. The thickness of the insulating layer can be, for example, greater than or equal to 1 nm and less than or equal to 100 nm, preferably greater than or equal to 10 nm and less than or equal to 50 nm. Here, a single layer of an insulating layer containing silicon oxide is formed by a plasma CVD method.

The conductive layer 524 is to be a gate electrode later. The conductive layer 524 can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. Note that in this embodiment, an example of the case where the layer containing a conductive material is formed using a metal material is described.

Figure 8C:
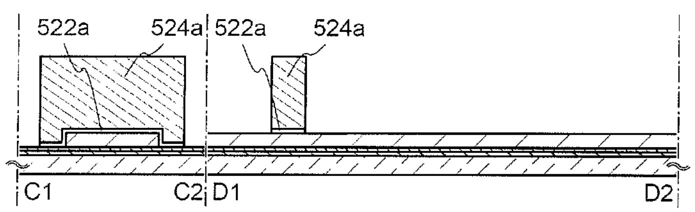

Next, the insulating layer 522 and the conductive layer 524 are selectively etched, so that the gate insulating layer 522*a* and the gate electrode 524*a* are formed over the semiconductor layer 520 (see FIG. 8C). As the etching, dry etching is preferably performed, but wet etching may be performed. An etching gas and an etchant can be selected as appropriate depending on materials to be etched.

Figure 8D:
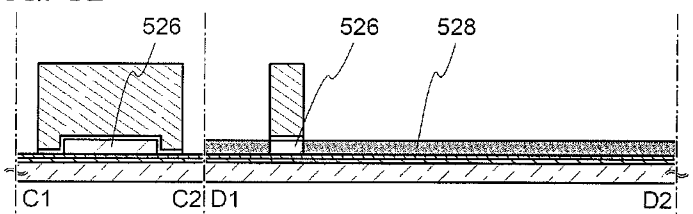

Next, an impurity element imparting one conductivity type is added to the semiconductor layer 520 with the gate electrode 524*a* used as a mask, so that a channel formation region 526 and the impurity regions 528 are formed (see FIG. 8D). Note that although phosphorus (P) or arsenic (As) is added here in order to form an n-channel transistor, an impurity element such as boron (B) or aluminum (Al) may be added in the case of forming a p-channel transistor. Here, the concentration of impurity elements added can be set as appropriate. In addition, heat treatment for activation is performed after the impurity element is added.

Note that when the semiconductor layer 520 is formed using a material containing silicon, a silicide region may be formed by forming silicide in part of the semiconductor layer 520 in order to further reduce the resistance of a source region and a drain region. The silicide region is formed in such a manner that metal is brought into contact with the semiconductor layer, and silicon in the semiconductor layer is made to react with the metal by heat treatment (e.g., a GRTA method, an LRTA method, laser light irradiation, or the like). For the silicide region, for example, cobalt silicide, nickel silicide, or the like may be used. In the case where the semiconductor layer 520 is thin, silicide reaction may proceed to a bottom portion of the semiconductor layer 520. As examples of a metal material used for forming silicide, titanium, tungsten, molybdenum, zirconium, hafnium, tantalum, vanadium, neodymium, chromium, platinum, palladium, and the like can be given in addition to cobalt and nickel.

Next, the electrode 530 is formed in a region which is in contact with part of the impurity region 528. After that, the insulating layer 532 and the insulating layer 534 are formed so as to cover the components formed in the above steps (see FIG. 8E).

For example, the electrode 530 is formed in such a manner that a layer containing a conductive material is formed and then the layer is selectively etched. The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed.

Note that the electrode 530 can be alternatively formed so as to fill an opening which is formed in the insulating layer 532 and the insulating layer 534 to reach the impurity region 528 after the formation of the insulating layer 532 and the insulating layer 534.

The insulating layer 532 and the insulating layer 534 can be formed using an inorganic insulating material such as silicon oxide, silicon oxynitride, silicon nitride, or aluminum oxide. The insulating layer 532 and the insulating layer 534 are particularly preferably formed using a low dielectric constant (low-k) material, in which case capacitance due to overlapping electrodes or wirings can be sufficiently reduced. Note that a porous insulating layer formed using such a material may be used as the insulating layer 532 and the insulating layer 534. A porous insulating layer has lower dielectric constant than an insulating layer with high density; thus, capacitance due to electrodes or wirings can be further reduced. Moreover, the insulating layer 532 and the insulating layer 534 can be formed using an organic insulating material such as polyimide or acrylic. Note that, although a stacked-layer structure of the insulating layer 532 and the insulating layer 534 is employed here, one embodiment of the disclosed invention is not limited thereto. A single-layer structure or a stacked-layer structure of two or more layers may also be used.

Figure 8E:
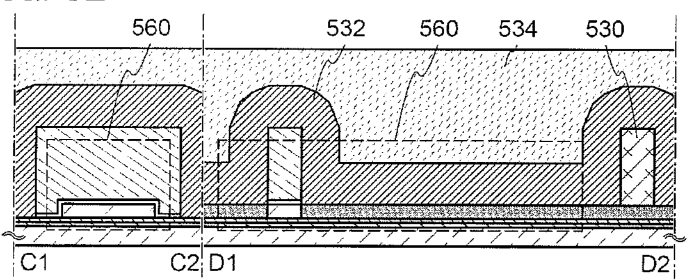

Through the above steps, the transistor 560 including the SOI substrate is manufactured (see FIG. 8E). The transistor 560 including a material which is not an oxide semiconductor can operate at a high speed. Thus, when the transistor 560 is used as a reading transistor, the reading speed can be increased. In addition, a logic circuit (also referred to as an arithmetic circuit) can be formed using the transistor 560.

Then, CMP treatment is performed on the insulating layer 532 and the insulating layer 534, so that upper surfaces of the gate electrode 524*a* and the electrode 530 are exposed (not illustrated). As treatment for exposing the upper surfaces of the gate electrode 524*a* and the electrode 530, etching treatment or the like can be employed as an alternative to (or in combination with) CMP treatment. Note that it is preferable to planarize the surfaces of the insulating layer 532 and the insulating layer 534 as much as possible in order to improve the characteristics of the transistor 562 which is manufactured later.

Note that an electrode, a wiring, a semiconductor layer, an insulating layer may be further formed before and after the above steps. For example, a multilayer wiring structure in which an insulating layer and a conductive layer are stacked is employed as a wiring structure, whereby a highly-integrated semiconductor device can be achieved.

After that, the transistor 562 and the capacitor 564 which are electrically connected to the transistor 560 are manufactured (FIG. 6A). Since manufacturing methods of the transistor 562 and the capacitor 564 are the same as those of the transistor 162 and the capacitor 164, the description of the manufacturing methods are omitted here. The above embodiment can be referred to for the details of the manufacturing methods.

The structures, methods, and the like described in this embodiment can be combined as appropriate with any of the structures, methods, and the like described in the other embodiments.

(Embodiment 3)

In this embodiment, a structure and a manufacturing method of a semiconductor device according to another embodiment of the disclosed invention will be described with reference to FIGS. 9A and 9B and FIGS. 10A to 10C.

<Cross-Sectional Structure and Planar Structure of Semiconductor Device>

Figure 9A:
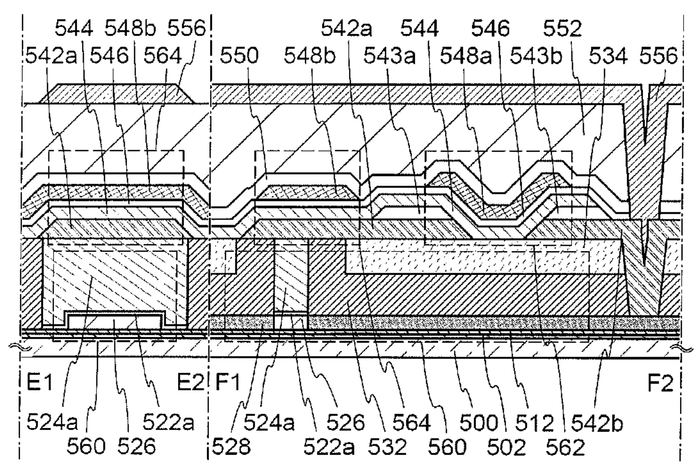
FIGS. 9A and 9B are a cross-sectional view and a plan view of a semiconductor device, respectively.
Figure 9B:
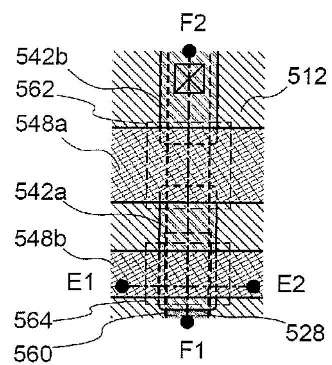

FIGS. 9A and 9B illustrate an example of a structure of a semiconductor device according to this embodiment. FIG. 9A is a cross-sectional view of the semiconductor device. FIG. 9B is a plan view of the semiconductor device. Here, FIG. 9A corresponds to a cross section taken along line E1-E2 and line F1-F2 in FIG. 9B. The semiconductor device illustrated in FIGS. 9A and 9B includes, similarly to the semiconductor device illustrated in FIGS. 6A and 6B, the transistor 560 including a first semiconductor material in its lower portion and the transistor 562 including a second semiconductor material in its upper portion. Here, it is preferable that the first semiconductor material and the second semiconductor material be different from each other. For example, the first semiconductor material can be a material (e.g., silicon) which is not an oxide semiconductor, and the second semiconductor material can be an oxide semiconductor. A transistor including a semiconductor material which is not an oxide semiconductor can easily operate at a high speed. In contrast, a transistor including an oxide semiconductor can hold electric charge for a long time owing to its characteristics.

One of the differences between the semiconductor device in FIGS. 9A and 9B and the semiconductor device in FIGS. 6A and 6B is a method of connecting the transistor 560 to the transistor 562. In the semiconductor device in FIGS. 6A and 6B, the electrode 530 is formed in a region overlapping with part of the impurity region 528, and the impurity region 528 in the lower transistor 560 and the source or drain electrode 542*b* in the upper transistor 562 are electrically connected to each other through the electrode 530. In contrast, in the semiconductor device in FIGS. 9A and 9B, the source or drain electrode 542*b* in the upper transistor 562 is directly in contact with the impurity region 528 in the lower transistor 560.

Another difference between the semiconductor device in FIGS. 9A and 9B and the semiconductor device in FIGS. 6A and 6B is a method of connecting the transistor 562 to the upper wiring 556. In the semiconductor device in FIGS. 6A and 6B, the electrode 554 which is in contact with the source or drain electrode 542*b* is formed, and the source or drain electrode 542*b* of the transistor 562 is electrically connected to the wiring 556 through the electrode 554. In contrast, in the semiconductor device in FIGS. 9A and 9B, the wiring 556 is directly in contact with the source or drain electrode 542*b* of the transistor 562. It can also be said that the source or drain electrode 542*b* of the transistor 562 and the electrode 530 which functions as a source or drain electrode of the transistor 560 in FIGS. 6A and 6B are provided as one component in FIGS. 9A and 9B.

Note that in FIGS. 9A and 9B, a region in which the source or drain electrode 542*b* is in contact with one of the source region and the drain region of the transistor 560 overlaps with a region in which the source or drain electrode 542*b* is in contact with the wiring 556 for connecting one memory cell to another memory cell. Such a layout allows an increase in the degree of integration.

The transistor 560 in FIGS. 9A and 9B is the same as the transistor 560 in FIGS. 6A and 6B. The transistor 562 in FIGS. 9A and 9B is the same as the transistor 562 in FIGS. 6A and 6B. Moreover, the capacitor 564 in FIGS. 9A and 9B is the same as the capacitor 564 in FIGS. 6A and 6B. The above embodiments can be referred to for the details.

<Manufacturing Method of Semiconductor Device>

Figure 10A:
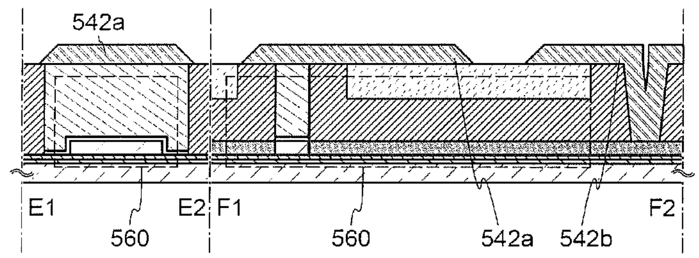
FIGS. 10A to 10C are cross-sectional views illustrating manufacturing steps of a semiconductor device.
Figure 10B:
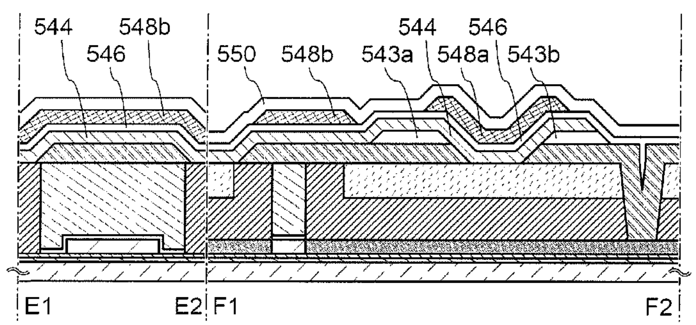
Figure 10C:
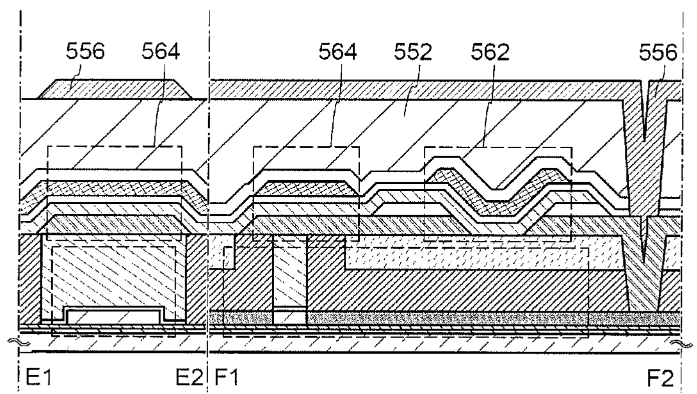

A manufacturing method of the semiconductor device illustrated in FIGS. 9A and 9B, particularly, the source or drain electrode of the upper transistor 562 will be described with reference to FIGS. 10A to 10C. Note that FIGS. 10A to 10C illustrate a manufacturing method of a semiconductor device using part of the SOI substrate formed by the method described with reference to FIGS. 7A to 7H.

First, in a manner similar to the steps illustrated in FIGS. 8A to 8D, a semiconductor layer including the channel formation region 526 and the impurity regions 528, the gate insulating layer 522*a*, and the gate electrode 524*a* are formed over the SOI substrate. After that, the insulating layer 532 and the insulating layer 534 are formed so as to cover the components formed in the above steps. Accordingly, the transistor 560 is manufactured.

Next, CMP treatment is performed on the insulating layer 532 and the insulating layer 534, so that an upper surface of the gate electrode 524*a* is exposed (not illustrated). As treatment for exposing the upper surface of the gate electrode 524*a*, etching treatment or the like can be employed as an alternative to (or in combination with) CMP treatment. Note that it is preferable to planarize the surfaces of the insulating layer 532 and the insulating layer 534 as much as possible in order to improve the characteristics of the transistor 562 which is manufactured later.

Next, an opening reaching the impurity region 528 of the transistor 560 is formed in the insulating layer 532 and the insulating layer 534. The opening is formed by selective etching using a mask or the like.

Then, a conductive layer is formed in a region including the opening by a PVD method, a CVD method, or the like. After that, part of the conductive layer is selectively removed by etching or CMP, so that the source or drain electrode 542*a* and the source or drain electrode 542*b* are formed (see FIG. 10A). The conductive layer is formed so as to fill the opening, whereby the impurity region 528 and the source or drain electrode 542*b* are directly in contact with each other.

Next, in a manner similar to the steps illustrated in FIGS. 4B to 4D and FIG. 5A in Embodiment 1, the insulating layer 543*a* and the insulating layer 543*b* are formed over the source or drain electrode 542*a* and the source or drain electrode 542*b*, respectively. After that, the oxide semiconductor layer 544 is provided over the source or drain electrode 542*a* and the source or drain electrode 542*b*, the gate insulating layer 546 is provided to be in contact with the oxide semiconductor layer 544, the gate electrode 548*a* and the electrode 548*b* are provided over the gate insulating layer 546, and the insulating layer 550 is provided over the gate electrode 548*a* and the electrode 548*b* (see FIG. 10B).

After that, the insulating layer 552 is formed over the insulating layer 550. The insulating layer 552 can be formed using a material and a method which are similar to those for the insulating layer 152 in Embodiment 1. After the insulating layer 552 is formed, an opening reaching the source or drain electrode 542*b* is formed in the insulating layer 552, the insulating layer 550, and the gate insulating layer 546. The opening can be formed by selective etching using a mask or the like.

Then, a conductive layer is formed in the region including the opening by a PVD method, a CVD method, or the like. After that, part of the conductive layer is selectively removed through etching treatment by CMP, so that the wiring 556 is formed.

Through the above steps, the semiconductor device described in this embodiment can be manufactured. In the semiconductor device described in this embodiment, the direct connection between the lower transistor 560 and the upper transistor 562 and the direct connection between the upper transistor 562 and the wiring 556 are each made through the source or drain electrode 542*b* of the transistor 562 without formation of an electrode; thus, a step of forming the electrode can be omitted. Therefore, the semiconductor device described in this embodiment can be manufactured at low cost.

The structures, methods, and the like described in this embodiment can be combined as appropriate with any of the structures, methods, and the like described in the other embodiments.

(Embodiment 4)

In this embodiment, a circuit configuration and operation of a semiconductor device according to one embodiment of the disclosed invention will be described with reference to FIGS. 11A to 11C. Note that in a circuit diagram, "OS" is written beside a transistor in order to indicate that the transistor includes an oxide semiconductor.

In the semiconductor device illustrated in FIG. 11A, a first wiring (a first line) is electrically connected to a source electrode of the transistor 160 (or the transistor 560), and a second wiring (a second line) is electrically connected to a drain electrode of the transistor 160 (or the transistor 560). A third wiring (a third line) is electrically connected to the other of the source electrode and the drain electrode of the transistor 162 (or the transistor 562), and a fourth wiring (a fourth line) is electrically connected to a gate electrode of the transistor 162 (or the transistor 562). Moreover, the gate electrode of the transistor 160 (or the transistor 560) and one of the source and drain electrodes of the transistor 162 (or the transistor 562) are electrically connected to one of the electrodes of the capacitor 164 (or the capacitor 564). A fifth wiring (a fifth line) is electrically connected to the other electrode of the capacitor 164 (or the capacitor 564).

Here, for example, the above transistor including an oxide semiconductor is used as the transistor 162 (or the transistor 562). A transistor including an oxide semiconductor has extremely low off-state current. For that reason, the potential of the gate electrode of the transistor 160 (or the transistor 560) can be held for a very long time by turning off the transistor 162 (or the transistor 562). When the capacitor 164 (or the capacitor 564) is provided, holding of electric charge applied to the gate electrode of the transistor 160 (or the transistor 560) and reading of stored data are facilitated.

Note that there is no particular limitation on the transistor 160 (or the transistor 560). In terms of increasing the speed of reading data, it is preferable to use, for example, a transistor with a high switching rate such as a transistor including single crystal silicon.

Alternatively, a structure in which the capacitor 164 (or the capacitor 564) is not provided as illustrated in FIG. 11B can be employed.

The semiconductor device illustrated in FIG. 11A utilizes the advantage that the potential of the gate electrode of the transistor 160 (or the transistor 560) can be held, thereby writing, storing, and reading data as described below.

First, writing and holding of data will be described. First, the potential of the fourth line is set to a potential at which the transistor 162 (or the transistor 562) is turned on, whereby the transistor 162 (or the transistor 562) is turned on. Accordingly, the potential of the third line is supplied to the gate electrode of the transistor 160 (or the transistor 560) and the capacitor 164 (or the capacitor 564). In other words, a predetermined charge is supplied to the gate electrode of the transistor 160 (or the transistor 560) (i.e., writing of data). Here, one of charges for supplying two different potentials (hereinafter, a charge for supplying a low potential is referred to as charge $Q_L$ and a charge for supplying a high potential is referred to as charge $Q_H$) is supplied to the gate electrode of the transistor 160 (or the transistor 560). Note that charges for supplying three or more different potentials may be supplied to increase the storage capacity. After that, the potential of the fourth line is set to a potential at which the transistor 162 (or the transistor 562) is turned off, whereby the transistor 162 (or the transistor 562) is turned off. Thus, the charge supplied to the gate electrode of the transistor 160 (or the transistor 560) is held (i.e., holding of data).

Since the off-state current of the transistor 162 (or the transistor 562) is extremely low, the charge of the gate electrode of the transistor 160 (or the transistor 560) is held for a long time.

Next, reading of data will be described. By supplying an appropriate potential (reading potential) to the fifth line with a predetermined potential (constant potential) supplied to the first line, the potential of the second line varies depending on the amount of charge held in the gate electrode of the transistor 160 (or the transistor 560). This is because in general, when the transistor 160 (or the transistor 560) is an n-channel transistor, an apparent threshold voltage $V_{th\_H}$ in the case where charge $Q_H$ is supplied to the gate electrode of the transistor 160 (or the transistor 560) is lower than an apparent threshold voltage $V_{th\_L}$ in the case where charge $Q_L$ is supplied to the gate electrode of the transistor 160 (or the transistor 560). Here, the apparent threshold voltage refers to the potential of the fifth line, which is needed to turn on the transistor 160 (or the transistor 560). Thus, the potential of the fifth line is set to potential $V_0$ that is intermediate between $V_{th\_H}$ and $V_{th\_L}$, whereby charge supplied to the gate electrode of the transistor 160 (or the transistor 560) can be determined. For example, in the case where charge $Q_H$ is supplied in writing, when the potential of the fifth line is set to $V_0$ ($>V_{th\_H}$), the transistor 160 (or the transistor 560) is turned on. In the case where charge $Q_L$ is supplied in writing, even when the potential of the fifth line is set to $V_0$ ($<V_{th\_L}$), the transistor 160 (or the transistor 560) remains off. Thus, the stored data can be read by the potential of the second line.

Note that in the case where memory cells are arrayed to be used, only data of desired memory cells needs to be read. Thus, in order that data of predetermined memory cells is read and data of the other memory cells is not read, in the case where the transistors 160 (or the transistors 560) are connected in parallel between the memory cells, a potential which allows the transistor 160 (or the transistor 560) to be turned off regardless of a state of the gate electrode, that is, a potential lower than $V_{th\_H}$ may be supplied to fifth lines of the memory cells whose data is not to be read. In the case where the transistors 160 (or the transistors 560) are connected in series between the memory cells, a potential which allows the transistor 160 (or the transistor 560) to be turned on regardless of the state of the gate electrode, that is, a potential higher than $V_{th\_L}$ may be supplied to the fifth line.

Next, rewriting of data will be described. Rewriting of data is performed in a manner similar to that of the above-described writing and holding of data. In other words, the potential of the fourth line is set to a potential at which the transistor 162 (or the transistor 562) is turned on, whereby the transistor 162 (or the transistor 562) is turned on. Accordingly, the potential of the third line (a potential for new data) is supplied to the gate electrode of the transistor 160 (or the transistor 560) and the capacitor 164 (or the capacitor 564). After that, the potential of the fourth line is set to a potential at which the transistor 162 (or the transistor 562) is turned off, whereby the transistor 162 (or the transistor 562) is turned off. Accordingly, a charge for new data is supplied to the gate electrode of the transistor 160 (or the transistor 560).

In the semiconductor device according to the disclosed invention, data can be directly rewritten by another writing of data as described above. Therefore, extraction of charge from a floating gate with the use of high voltage, which is needed in a flash memory or the like, is not necessary. Thus, a reduction in operation speed, which is attributed to erasing operation, can be suppressed. In other words, high-speed operation of the semiconductor device can be achieved.

Note that the source electrode or the drain electrode of the transistor 162 (or the transistor 562) is electrically connected to the gate electrode of the transistor 160 (or the transistor 560), thereby having an effect similar to that of a floating gate of a floating gate transistor used as a nonvolatile memory element. Therefore, a portion in the drawing where the source electrode or the drain electrode of the transistor 162 (or the transistor 562) is electrically connected to the gate electrode of the transistor 160 (or the transistor 560) is called a floating gate portion FG in some cases. When the transistor 162 is off, the floating gate portion FG can be regarded as being embedded in an insulator; thus, charge is held in the floating gate portion FG. The amount of the off-state current of the transistor 162 (or the transistor 562) including an oxide semiconductor is less than or equal to one hundred thousandth of the amount of off-state current of a transistor including silicon or the like; thus, loss of the charge accumulated in the floating gate portion FG due to leakage current in the transistor 162 (or the transistor 562) is negligible. In other words, with the transistor 162 (or the transistor 562) including an oxide semiconductor, a nonvolatile memory device which can store data even when power is not supplied can be achieved.

For example, when the off-state current of the transistor 162 (or the transistor 562) at room temperature (25° C.) is less than or equal to 10 zA (1 zA (zeptoampere) is $1\times10^{-21}$ A) and the capacitance of the capacitor 164 (or the capacitor 564) is approximately 10 fF, data can be stored for $10^4$ seconds or longer. It is needless to say that the storage time depends on the transistor characteristics and the capacitance.

Further, in that case, a problem of deterioration of a gate insulating film (tunneling insulating film), which occurs in a conventional floating gate transistor, does not exist. In other words, the deterioration of a gate insulating film due to injection of electrons into a floating gate, which has been conventionally regarded as a problem, can be avoided. This means that there is no limit on the number of times of writing in principle. Furthermore, high voltage, which is needed for writing or erasing of data in a conventional floating gate transistor, is not necessary.

The components such as transistors included in the semiconductor device illustrated in FIG. 11A can be considered to include a resistor and a capacitor as illustrated in FIG. 11C. In other words, in FIG. 11C, the transistor 160 (or the transistor 560) and the capacitor 164 (or the capacitor 564) are each considered to include a resistor and a capacitor. R1 and C1 denotes the resistance and the capacitance of the capacitor 164 (or the capacitor 564), respectively. The resistance R1 corresponds to resistance which depends on the insulating layer included in the capacitor 164 (or the capacitor 564). R2 and C2 denote the resistance and the capacitance of the transistor 160 (or the transistor 560), respectively. The resistance R2 corresponds to the resistance which depends on the gate insulating layer at the time when the transistor 160 (or the transistor 560) is on. The capacitance C2 corresponds to the capacitance of so-called gate capacitance (capacitance formed between the gate electrode and the source electrode or the drain electrode and capacitance formed between the gate electrode and the channel formation region).

A charge holding period (also referred to as a data holding period) is determined mainly by the off-state current of the transistor 162 (or the transistor 562) under the conditions that gate leakage of the transistor 162 (or the transistor 562) is sufficiently small and that R1 and R2 satisfy the relations R1≥ROS and R2≥ROS, where the resistance value (also referred to as effective resistance) between the source electrode and the drain electrode in the case where the transistor 162 (or the transistor 562) is off is ROS.

On the other hand, in the case where the conditions are not satisfied, it is difficult to sufficiently secure the holding period even if the off-state current of the transistor 162 (or the transistor 562) is sufficiently small. This is because leakage current other than the off-state current of the transistor 162 (or the transistor 562) (e.g., leakage current generated between the source electrode and the gate electrode) is large. Thus, it can be said that the above relation is preferably satisfied in the semiconductor device disclosed in this embodiment.

It is preferable that C1 and C2 satisfy the relation C1≥C2. This is because if C1 is large, the potential of the fifth line can be efficiently supplied to the floating gate portion FG when the potential of the floating gate portion FG is controlled by the fifth line, so that the difference between potentials supplied to the fifth line (e.g., a potential at the time of reading and a potential at the time of non-reading) can be kept small.

When the above relation is satisfied, a more preferable semiconductor device can be achieved. Note that R1 and R2 are controlled by the gate insulating layer of the transistor 160 (or the transistor 560) and the insulating layer of the capacitor 164 (or the capacitor 564). The same applies to C1 and C2. Therefore, it is preferable that the material, thickness, and the like of the gate insulating layer be set as appropriate so as to satisfy the above relation.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since voltage applied to a control gate is high, it is necessary to keep a proper distance between cells in order to prevent the potential from affecting a floating gate of the adjacent cell. This is one of factors inhibiting an increase in the degree of integration of the semiconductor device. The factor is attributed to a basic principle of a flash memory that tunneling current is generated by application of a high electrical field.

In contrast, the semiconductor device according to this embodiment is operated by switching of a transistor including an oxide semiconductor and does not use the above-described principle of charge injection by tunneling current. In other words, a high electric field for charge injection is not necessary unlike a flash memory. Accordingly, it is not necessary to consider an influence of a high electric field from a control gate on the adjacent cell, which facilitates an increase in the degree of integration.

In addition, the semiconductor device according to this embodiment is advantageous over a flash memory also in that a high electric field is not necessary and that a large peripheral circuit (e.g., a booster circuit) is not necessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two levels (one bit) of data are written.

In the case where the dielectric constant ∈r1 of the insulating layer included in the capacitor 164 (or the capacitor 564) is different from the dielectric constant ∈r2 of the insulating layer included in the transistor 160 (or the transistor 560), C1 can easily be made greater than or equal to C2 while S1 which is the area of the insulating layer included in the capacitor 164 (or the capacitor 564) and S2 which is the area of an insulating layer forming gate capacitance of the transistor 160 (or the transistor 560) satisfy the relation where 2×S2 is greater than or equal to S1 (preferably, while S2 is greater than or equal to S1). In other words, C1 can easily be made greater than or equal to C2 while the area of the insulating layer included in the capacitor 164 (or the capacitor 564) is reduced. Specifically, for example, when a film formed of a high-k material such as hafnium oxide or a stack of a film formed of a high-k material such as hafnium oxide and a film formed of an oxide semiconductor is used for the insulating layer included in the capacitor 164 (or the capacitor 564), ∈r1 can be set to 10 or more, preferably 15 or more, and when silicon oxide is used for the insulating layer forming the gate capacitance, ∈r2 can be set to 3 to 4.

A combination of such structures makes it possible to increase the degree of integration of the semiconductor device according to the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to the case where two levels of data are written. The multilevel technique can be achieved by, for example, giving charge Q, which is different from charge $Q_L$ for supplying a low potential and charge $Q_H$ for supplying a high potential, to the gate electrode of the first transistor, in addition to the charge $Q_L$ and the charge $Q_H$. In this case, enough storage capacity can be secured even when a circuit configuration in which $F^2$ is not sufficiently small is employed.

Note that, although an n-channel transistor in which electrons are majority carriers is used in the above description, it is needless to say that a p-channel transistor in which holes are majority carriers can be used instead of the n-channel transistor.

As described above, the semiconductor device according to this embodiment is suitable for increasing the degree of integration. Note that according to one embodiment of the present invention, a wiring is shared and the contact area is reduced; thus, a semiconductor device in which the degree of integration is further increased can be provided.

The structures, methods, and the like described in this embodiment can be combined as appropriate with any of the structures, methods, and the like described in the other embodiments.

(Embodiment 5)

In this embodiment, an application example of the semiconductor devices described in the above embodiments will be described. Specifically, an example of a semiconductor device in which the semiconductor devices described in the above embodiments are arranged in matrix will be described.

Figure 12:
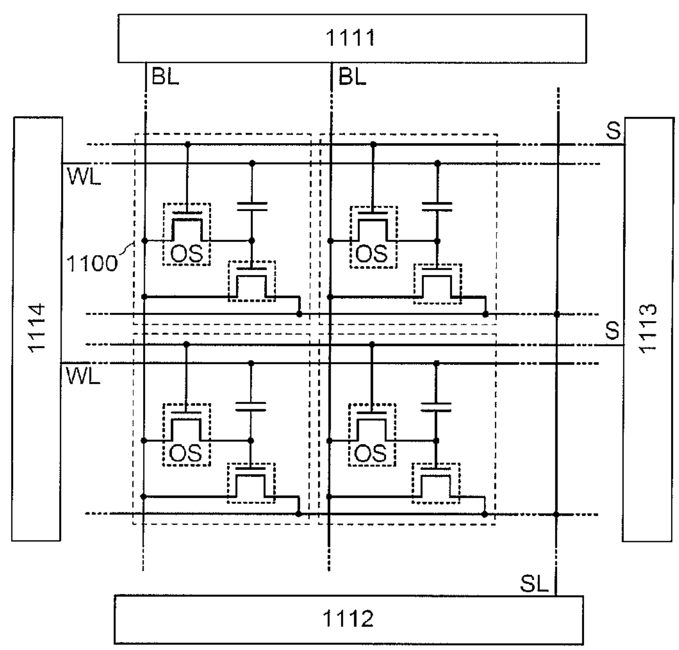
FIG. 12 is a circuit diagram of a semiconductor device.

FIG. 12 is an example of a circuit diagram of a semiconductor device having a storage capacity of (m×n) bits.

The semiconductor device according to one embodiment of the present invention includes a memory cell array which includes in an is an integer of 2 or more) signal lines S, m word lines WL, n (n is an integer of 2 or more) bit lines BL, k (k is a natural number of less than n) source lines SL, and memory cells 1100 arranged in matrix of m (rows) (in a vertical direction)×n (columns) (in a horizontal direction); and peripheral circuits such as a first driver circuit 1111, a second driver circuit 1112, a third driver circuit 1113, and a fourth driver circuit 1114. Here, the configuration described in the above embodiment (the configuration illustrated in FIG. 11A) is applied to the memory cell 1100.

Each of the memory cells 1100 includes a first transistor, a second transistor, and a capacitor. In each of the memory cells 1100, a gate electrode of the first transistor, one of a source electrode and a drain electrode of the second transistor, and one of electrodes of the capacitor are electrically connected to one another, and the source line SL and a source electrode (a source region) of the first transistor are electrically connected to each other. Furthermore, the bit line BL, the other of the source electrode and the drain electrode of the second transistor, and a drain electrode of the first transistor are electrically connected to one another. The word line WL and the other of the electrodes of the capacitor are electrically connected to each other. The signal line S and a gate electrode of the second transistor are electrically connected to each other. In other words, the source line SL corresponds to the first line in the configuration illustrated in FIG. 11A, the bit line BL corresponds to the second line and the third line, the signal line S corresponds to the fourth line, and the word line WL corresponds to the fifth line.

In the memory cell array illustrated in FIG. 12, the bit lines BL, the source lines SL, the word lines WL, and the signal lines S form the matrix arrangement. To one of the bit lines BL, m memory cells 1100 arranged in the same column are connected. In addition, n memory cells 1100 arranged in the same row are connected to one of the word lines WL and one of the signal lines S. Further, the number of the source lines SL is smaller than that of the bit lines BL; therefore, a plurality of memory cells including at least the memory cells 1100 connected to different bit lines BL needs to be connected to one of the source lines. In other words, j (j is an integer greater than or equal to (m+1) and less than or equal to (m×n)) memory cells 1100 are connected to one of the source lines SL. Note that source regions of the first transistors included in the plurality of memory cells 1100 connected to one of the source line SL are formed in the same layer. Note that it is preferable that the source line SL be arranged in the proportion of one to a plurality of bit lines BL (i.e., (n/k) is an integer). In that case, if an equal number of the memory cells 1100 is connected to each source line SL, (m×n/k) memory cells 1100 are connected to one of the source lines SL. Specifically, for example, a planar layout illustrated in FIG. 13 can be employed. Note that in FIG. 13, the source line SL is provided in a region corresponding to a region 180 and is electrically connected to the metal compound region 124 in a contact region 182.

Figure 13:
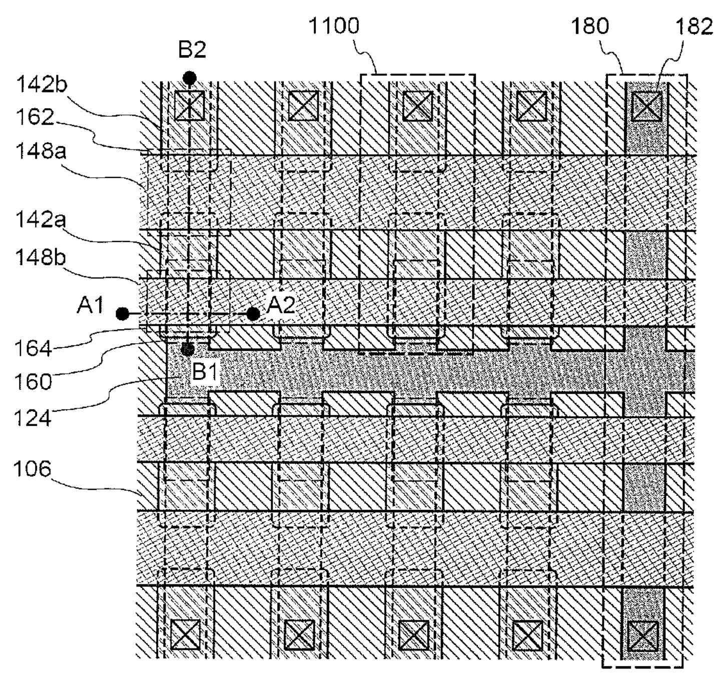
FIG. 13 is a plan view of a semiconductor device.

As in the memory cell arrays illustrated in FIG. 12 and FIG. 13, one of the source lines SL which connects one of the memory cells 1100 to another memory cell is connected to a plurality of memory cells 1100 including at least the memory cells connected to different bit lines BL to make the number of source lines SL smaller than that of bit lines BL, whereby the number of source lines can be made sufficiently small; thus, the degree of integration of the semiconductor device can be increased.

The bit lines BL are electrically connected to the first driver circuit 1111. The source lines SL are electrically connected to the second driver circuit 1112. The signal lines S are electrically connected to the third driver circuit 1113. The word lines WL are electrically connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A driver circuit having any one or some of the functions may alternatively be used.

Figure 14:
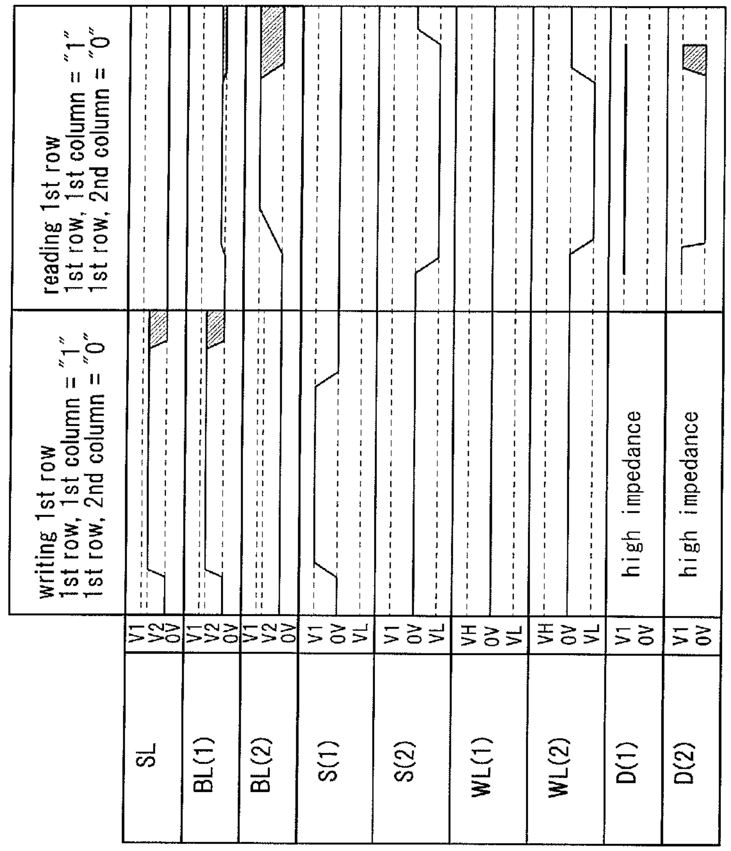
FIG. 14 is a timing chart.

Next, writing operation and reading operation will be described. FIG. 14 is an example of a timing chart of writing operation and reading operation of the semiconductor device illustrated in FIG. 12.

Although operation of a semiconductor device of a memory cell array of two rows and two columns will be described for simplification here, the disclosed invention is not limited to this.

Writing data to the memory cell 1100 (1,1) and the memory cell 1100 (1,2) which are in the first row and reading data from the memory cell 1100 (1,1) and the memory cell 1100 (1,2) which are in the first row will be described. Note that in the following description, it is assumed that data to be written to the memory cell (1,1) is "1" and data to be written to the memory cell (1,2) is "0".

First, the writing operation will be described. A potential V1 is supplied to a signal line S(1) of the first row to turn on the second transistors of the first row. Further, a potential of 0 V is supplied to a signal line S(2) of the second row to turn off the second transistors of the second row.

Further, a potential V2 is supplied to the bit line BL(1) of the first column and a potential of 0 V is supplied to the bit line BL(2) of the second column.

As a result, the potential V2 and the potential of 0 V are supplied to a floating gate portion FG of the memory cell (1,1) and a floating gate portion FG of the memory cell (1,2), respectively. Here, the potential V2 is higher than the threshold voltage of the first transistor. Then, the potential of the signal line S(1) of the first row is set to 0 V to turn off the second transistors of the first row. Thus, the writing is completed. It is preferable that the potential V2 be substantially equal to the potential V1 or lower than or equal to the potential V1.

Note that the word line WL(1) of the first row and the word line WL(2) of the second row are at a potential of 0 V during the writing operation. At the end of the writing, before the potential of the bit line BL(1) of the first column is changed, the potential of the signal line S(1) of the first row is set to 0 V. After the writing, the threshold voltage of a memory cell is Vw0 in the case where data "0" has been written and Vw1 in the case where data "1" has been written. Here, the threshold voltage of the memory cell means the voltage of the terminal connected to the word line WL, which changes the resistance between the source electrode and the drain electrode of the first transistor. Note that here, the relation Vw0>0>Vw1 is satisfied.

Figure 15:
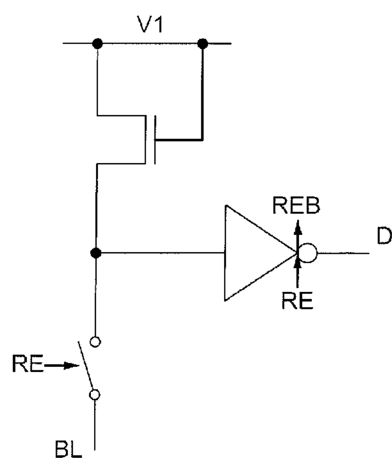
FIG. 15 is a circuit diagram of a semiconductor device.

Next, the reading operation will be described. Here, a reading circuit illustrated in FIG. 15 is electrically connected to the bit line BL.

First, a potential of 0 V is applied to the word line WL(1) of the first row, and potential VL is applied to the word line WL(2) of the second row. The potential VL is lower than the threshold voltage Vw1. When the word line WL(1) is at a potential of 0 V, in the first row, the first transistor of the memory cell in which data "0" is stored is turned off, and the first transistor of the memory cell in which data "1" is stored is turned on. When the word line WL(2) is at the potential VL, in the second row, the first transistors of the memory cells in which either data "0" or data "1" is stored are turned off.

As a result, the first transistor of the memory cell (1,1) between the bit line BL(1) and the source line SL is turned on, thereby having low resistance, and the first transistor of the memory cell (1,2) between the bit line BL(2) and the source line SL(1) is turned off, thereby having high resistance. A reading circuit connected to the bit line BL(1) and the bit line BL(2) can read data on the basis of a difference in resistance between the bit lines.

Note that during the reading operation, a potential of 0 V is supplied to the signal line S(1) and the potential VL is supplied to the signal line S(2) to turn off all the second transistors. The potential of the floating gate portions FG of the first row is 0 V or V2; thus, all the second transistors can be turned off by setting the potential of the signal line S(1) to 0 V. On the other hand, when the potential VL is applied to the word line WL(2), the potential of the floating gate portions FG of the second row is lower than the potential right after data writing. Therefore, in order to prevent the second transistors from being turned on, the signal line S(2) is made to have a potential as low as the word line WL(2) (i.e., the potential of the signal line S(2) is set to the potential VL). In other words, the potentials of the signal line S and the word line WL in the row where data is not read are set to the same low potential (the potential VL). Thus, all the second transistors can be turned off.

Next, an output potential in the case where the circuit illustrated in FIG. 15 is used as a reading circuit will be described. In the reading circuit illustrated in FIG. 15, the bit line BL is connected to a clocked inverter and a transistor which is diode-connected to a wiring to which the potential V1 is supplied through a switching element controlled by a read enable signal (RE signal). Further, a fixed potential (e.g., 0 V) is supplied to the source line SL. Since the resistance between the bit line BL(1) and the source line SL is low, a low potential is supplied to a clocked inverter and an output D(1) is a signal High. Since the resistance between the bit line BL(2) and the source line SL is high, a high potential is supplied to the clocked inverter and an output D(2) is a signal Low.

Examples of the operating potentials are V1=2 V, V2=1.5 V, VH=2 V, and VL=−2 V.

Figure 16:
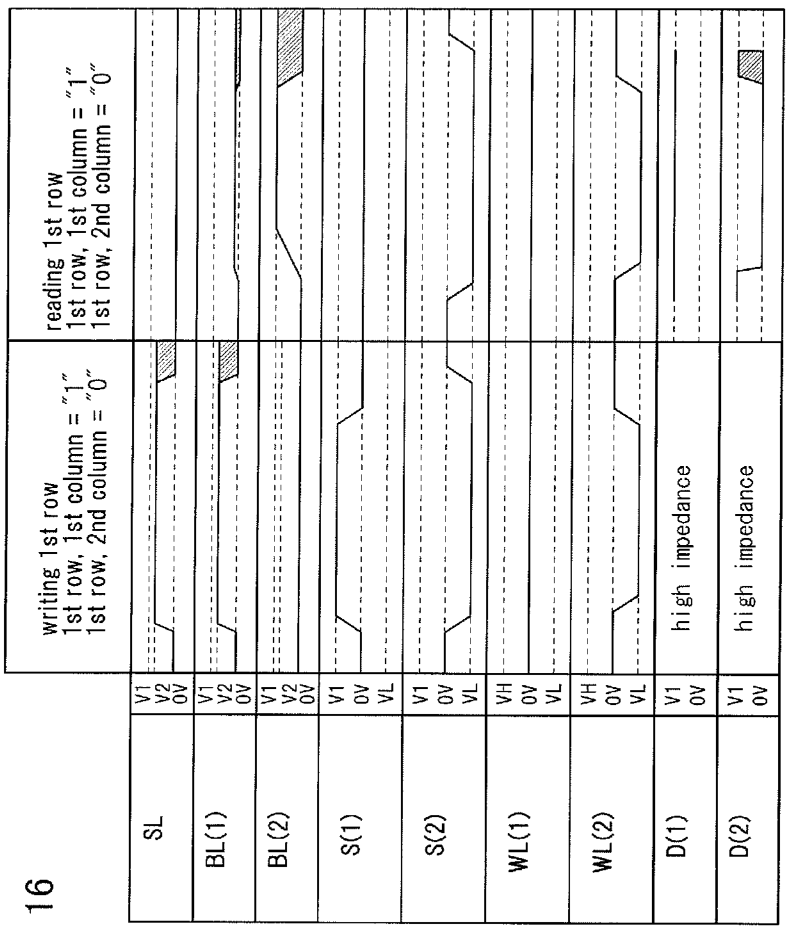
FIG. 16 is a timing chart.

Next, writing operation which is different from the above-described writing operation will be described. The data to be written is the same as that in the described-above writing operation. FIG. 16 is an example of a timing chart of the writing operation and reading operation.

In the writing operation based on the timing chart of FIG. 14 (i.e., writing to the first row), the potential of the word line WL(2) at the time of writing is set to a potential of 0 V; thus, for example, in the case where data which has been written to the memory cell (2,1) or the memory cell (2,2) is data "1", steady-state current flows between the bit line BL(1) and the bit line BL(2). That is because at the time of the writing to the first row, the first transistors in the memory cells of the second row are turned on, whereby the bit line BL(1) and the bit line BL(2) are connected at low resistance through the source line.

In the writing operation illustrated in FIG. 16, such steady-state current is less likely to be generated.

A potential V1 is supplied to the signal line S(1) of the first row to turn on the second transistors of the first row. Further, a potential of 0 V is supplied to the signal line S(2) of the second row to turn off the second transistors of the second row.

Further, potential V2 is supplied to the bit line BL(1) of the first column and a potential of 0 V is supplied to the bit line BL(2) of the second column.

As a result, the potential V2 and the potential of 0 V are supplied to a floating gate portion FG of the memory cell (1,1) and a floating gate portion FG of the memory cell (1,2), respectively. Here, the potential V2 is higher than the threshold voltage of the first transistor. Then, the potential of the signal line S(1) of the first row is set to 0 V to turn off the second transistors of the first row. Thus, the writing is completed.

Note that the word line WL(1) of the first row is at a potential of 0 V and the word line WL(2) of the second row is at the potential VL during the writing operation. When the word line WL(2) of the second row is at the potential VL, in the second row, the first transistors of the memory cells in which either data “0” or data “1” is stored are turned off. Further, the potential V2 is supplied to the source line SL during the writing operation. In the case where all the written data are data “0”, a potential of 0 V may be supplied to the source line.

At the end of the writing, before the potential of the bit line BL(1) of the first column is changed, the potential of the signal line S(1) of the first row is set to 0 V. After the writing, the threshold voltage of a memory cell is Vw0 in the case where data “0” has been written and Vw1 in the case where data “1” has been written. Here, the relation Vw0>0>Vw1 is satisfied.

In the writing operation, the first transistors in the memory cells of the row to which data is not written (in this case, the second row) are off. From this point, only the row to which data is written has a problem of steady-state current between the bit line and the source line. In the case where data “0” is written to the memory cells of the row to which data is written, the first transistors in the memory cells are off; thus, a problem of steady-state current does not occur. In contrast, in the case where data “1” is written to the memory cells of the row to which data is written, the first transistors in the memory cells are on; thus, steady-state current occurs if there is a potential difference between the source line SL and the bit line BL (in this case, the bit line BL(1)). The potential of the source line SL is made to be equal to the potential V2 of the bit line BL(1), whereby steady-state current between the bit line and the source line can be prevented.

As described above, generation of steady-state current at the time of writing can be prevented by the writing operation. In other words, power consumed at the time of the writing operation can be sufficiently reduced controlled in the writing operation.

Note that the reading operation is performed in a manner similar to that of the above-described reading operation.

A semiconductor device including an oxide semiconductor, whose off-state current is extremely low, is used as the semiconductor device illustrated in FIG. 12, whereby stored data can be held for a very long time. In other words, power consumption can be sufficiently reduced because refresh operation becomes unnecessary or the frequency of refresh operation can be extremely low. Moreover, stored data can be held for a long time even when power is not supplied.

Further, in the semiconductor device illustrated in FIG. 12, high voltage is not needed for writing data and there is no problem of deterioration of elements. Therefore, the semiconductor device illustrated in FIG. 12 does not have a limitation on the number of times of writing, which is a problem in a conventional nonvolatile memory; thus, the reliability thereof is drastically improved. Further, data is written by switching on and off of the transistor, whereby high-speed operation can be easily achieved. In addition, there is no need of operation for erasing data.

A transistor including a material which is not an oxide semiconductor can operate at a higher speed than a transistor including an oxide semiconductor; thus, when it is combined with a transistor including an oxide semiconductor, a semiconductor device can perform operation (e.g., data reading operation) at a sufficiently high speed. Further, with a transistor including a material which is not an oxide semiconductor, a variety of circuits (e.g., a logic circuit, a driver circuit, and the like) for which high-speed operation is required can be favorably achieved.

A semiconductor device includes both the transistor including a material which is not an oxide semiconductor and the transistor including an oxide semiconductor, whereby the semiconductor device can have novel features.

Furthermore, in the semiconductor device illustrated in FIG. 12, the number of wirings per memory cell can be reduced. Accordingly, the area of memory cells can be reduced and the storage capacity per unit area of the semiconductor device can be increased.

The structures, methods, and the like described in this embodiment can be combined as appropriate with any of the structures, methods, and the like described in the other embodiments.

(Embodiment 6)

In this embodiment, the case where the semiconductor device described in any of the above embodiments is applied to electronic devices will be described with reference to FIGS. 17A to 17F. In this embodiment, the case where the above semiconductor device is applied to electronic devices such as a computer, a mobile phone (also referred to as a mobile telephone or a mobile telephone device), a portable information terminal (including a portable game console, an audio player, and the like), a digital camera, a digital video camera, an electronic paper, and a television device (also referred to as a television or a television receiver).

Figure 17A:
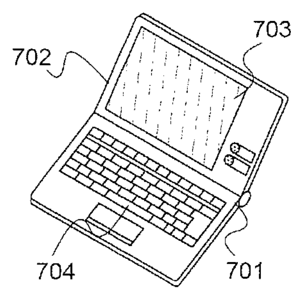
FIGS. 17A to 17F are diagrams each illustrating an electronic device including a semiconductor device.

FIG. 17A is a notebook personal computer including a housing 701, a housing 702, a display portion 703, a keyboard 704, and the like. The semiconductor device described in any of the above embodiments is provided in at least one of the housing 701 and the housing 702. Consequently, the notebook personal computer can perform writing and reading of data at a high speed and store data for a long time with sufficiently reduced power consumption.

Figure 17D:
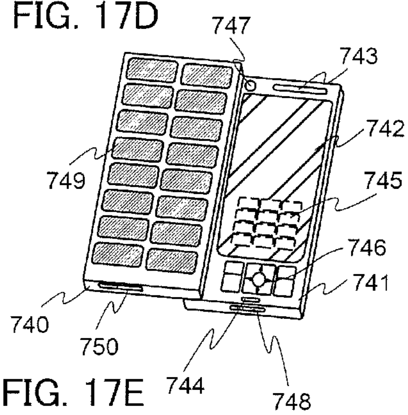
Figure 17B:
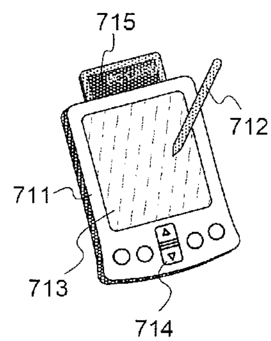

FIG. 17B is a portable information terminal (personal digital assistant (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Consequently, the portable information terminal can perform writing and reading of data at a high speed and store data for a long time with sufficiently reduced power consumption.

Figure 17E:
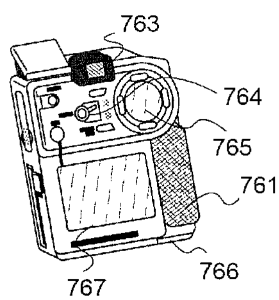
Figure 17C:
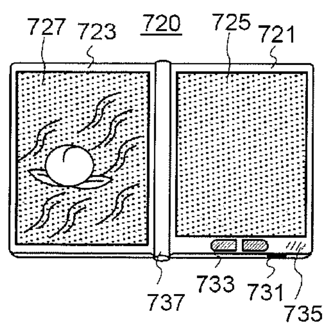

FIG. 17C is an e-book reader 720 including an electronic paper. The e-book reader has two housings: a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. At least one of the housing 721 and the housing 723 is provided with the semiconductor device described in any of the above embodiments. Consequently, the e-book reader can perform writing and reading of data at a high speed and store data for a long time with sufficiently reduced power consumption.

FIG. 17D is a mobile phone including two housings: a housing 740 and a housing 741. Further, the housing 740 and the housing 741 in a state where they are developed as illustrated in FIG. 17D can shift by sliding so that one is lapped over the other; therefore, the size of the mobile phone can be reduced, which makes the mobile phone suitable for being carried. The housing 741 is provided with a display panel 742, a speaker 743, a microphone 744, operation keys 745, a pointing device 746, a camera lens 747, an external connection terminal 748, and the like. The housing 740 is provided with a solar cell 749 that charges the mobile phone, an external memory slot 750, and the like. In addition, an antenna is incorporated in the housing 741. At least one of the housing 740 and the housing 741 is provided with the semiconductor device described in any of the above embodiments. Consequently, the mobile phone can perform writing and reading of data at a high speed and store data for a long time with sufficiently reduced power consumption.

FIG. 17E is a digital camera including a main body 761, a display portion 767, an eyepiece 763, an operation switch 764, a display portion 765, a battery 766, and the like. The semiconductor device described in any of the above embodiments is provided in the main body 761. Consequently, the digital camera can perform writing and reading of data at a high speed and store data for a long time with sufficiently reduced power consumption.

Figure 17F:
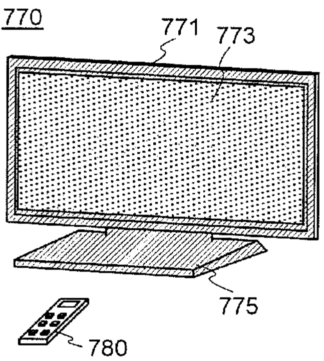

FIG. 17F is a television device 770 including a housing 771, a display portion 773, a stand 775, and the like. The television device 770 can be operated by an operation switch of the housing 771 or a separate remote control 780. The semiconductor device described in any of the above embodiments is mounted in the housing 771 and the remote control 780. Consequently, the television device can perform writing and reading of data at a high speed and store data for a long time with sufficiently reduced power consumption.

Thus, the semiconductor device according to any of the above embodiments is mounted in the electronic devices described in this embodiment. Accordingly, electronic devices with low power consumption can be achieved.

EXAMPLE 1

In this example, results obtained by measuring the off-state current of a transistor including a purified oxide semiconductor will be described.

Figure 18:
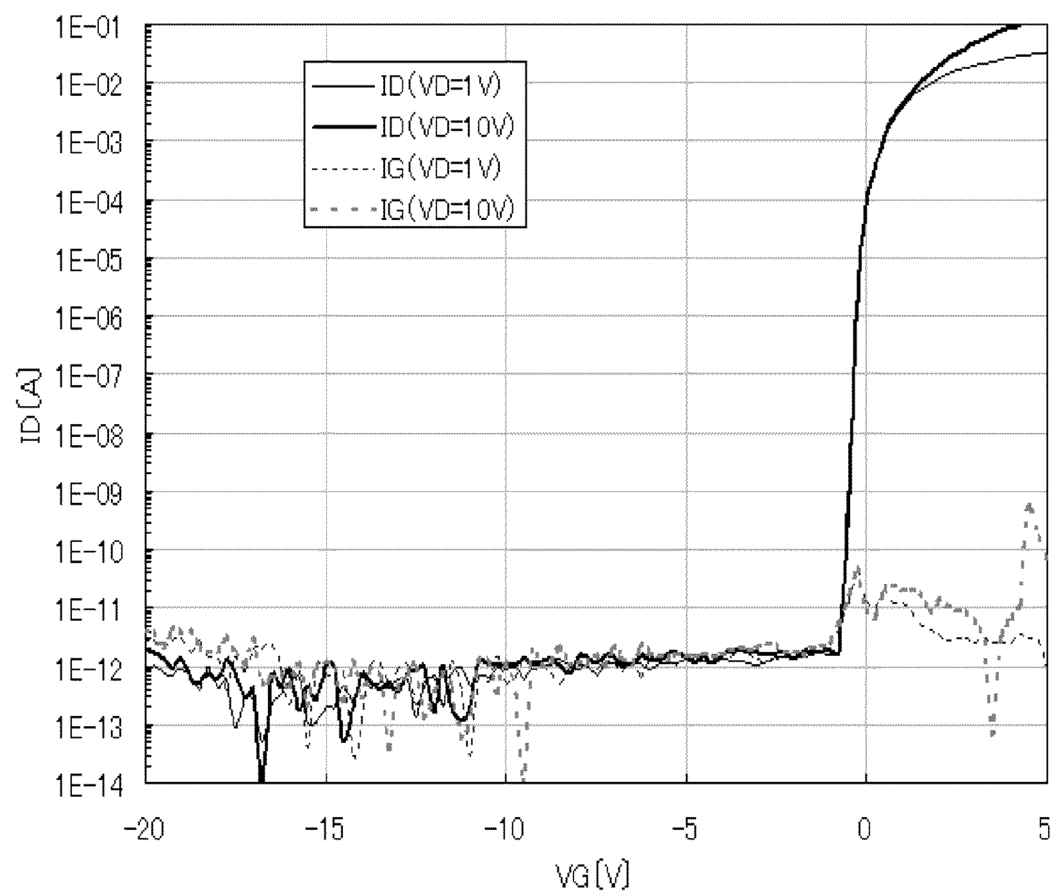
FIG. 18 is a graph showing characteristics of a transistor including an oxide semiconductor.

First, a transistor with a channel width W of 1 m, which was sufficiently large, was prepared in consideration of the fact that the off-state current of a transistor including a purified oxide semiconductor is very low, and the off-state current of the transistor was measured. FIG. 18 shows the results obtained by measuring the off-state current of the transistor with a channel width W of 1 m. In FIG. 18, the horizontal axis represents the gate voltage VG and the vertical axis represents the drain current ID. In the case where the drain voltage VD is +1 V or +10 V and the gate voltage VG is in a range of −5 V to −20 V, the off-state current of the transistor was found to be lower than or equal to $1\times10^{-12}$ A which is the detection limit. Moreover, it was found that the off-state current (here, current per micrometer (μm) of channel width) of the transistor is lower than or equal to 1 aA/μm ($1\times10^{-18}$ A/μm).

Next, the results obtained by more accurately measuring the off-state current of the transistor including a purified oxide semiconductor will be described. As described above, the off-state current of the transistor including a purified oxide semiconductor was found to be lower than or equal to $1\times10^{-12}$ A which is the detection limit of the measurement equipment. Here, the results obtained by measuring a more accurate off-state current value (a value smaller than or equal to the detection limit of the measurement equipment in the above measurement), with the use of an element for characteristic evaluation, will be described.

First, the element for characteristic evaluation which was used in a method of measuring current will be described with reference to FIG. 19.

Figure 19:
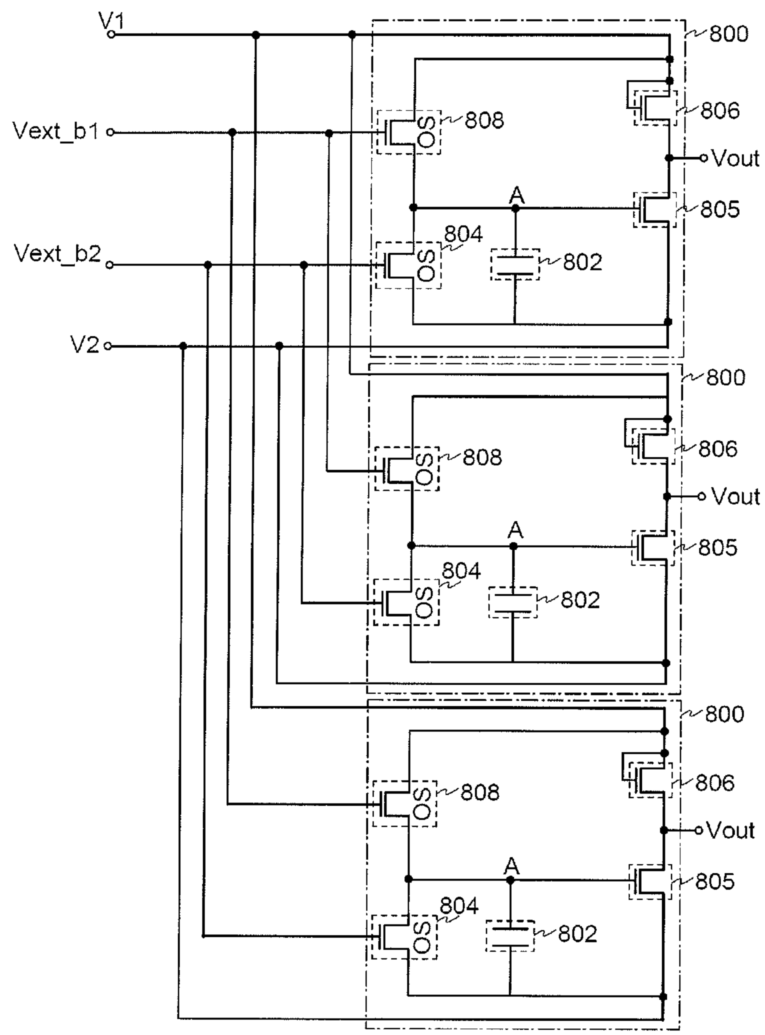
FIG. 19 is a diagram of a circuit for evaluating characteristics of a transistor including an oxide semiconductor.

In the element for characteristic evaluation in FIG. 19, three measurement systems 800 are connected in parallel. The measurement system 800 includes a capacitor 802, a transistor 804, a transistor 805, a transistor 806, and a transistor 808. A transistor including a purified oxide semiconductor was used as each of the transistors 804, 805, and 806.

In the measurement system 800, one of a source terminal and a drain terminal of the transistor 804, one of terminals of the capacitor 802, and one of a source terminal and a drain terminal of the transistor 805 are connected to a power source (for supplying a potential V2). The other of the source terminal and the drain terminal of the transistor 804, one of a source terminal and a drain terminal of the transistor 808, the other of the terminals of the capacitor 802, and a gate terminal of the transistor 805 are connected to one another. The other of a source terminal and a drain terminal of the transistor 808, one of a source terminal and a drain terminal of the transistor 806, and a gate terminal of the transistor 806 are connected to a power source (for supplying a potential V1). The other of the source terminal and the drain terminal of the transistor 805, the other of the source terminal and the drain terminal of the transistor 806 are connected to each other, and the node serves as an output terminal of Vout.

A potential Vext_b2 for controlling whether to turn on or off the transistor 804 is supplied to a gate terminal of the transistor 804. A potential Vext_b1 for controlling whether to turn on or off the transistor 808 is supplied to a gate terminal of the transistor 808. A potential Vout is output from the output terminal.

Next, a method of measuring current with the use of the element for characteristic evaluation will be described.

First, an initialization period in which a potential difference is applied to measure the off-state current will be briefly described. In the initialization period, the potential Vext_b1 for turning on the transistor 808 is input to the gate terminal of the transistor 808, and the potential V1 is applied to a node A which is a node connected to the other of the source terminal and the drain terminal of the transistor 804 (i.e., the node connected to one of the source terminal and the drain terminal of the transistor 808, the other terminal of the capacitor 802, and the gate terminal of the transistor 805). Here, the potential V1 is, for example, a high potential. The transistor 804 is kept off.

After that, the potential Vext_b1 for turning off the transistor 808 is input to the gate terminal of the transistor 808, whereby the transistor 808 is turned off. After the transistor 808 is turned off, the potential V1 is set to a low potential. The transistor 804 is still off. The potential V2 is set to the same potential as the potential V1. Thus, the initialization period is completed. When the initialization period is completed, a potential difference is generated between the node A and one of the source electrode and the drain electrode of the transistor 804. In addition, a potential difference is generated between the node A and the other of the source electrode and the drain electrode of the transistor 808. Accordingly, a small amount of charge flows through the transistor 804 and the transistor 808. In other words, off-state current flows.

Next, a measurement period of the off-state current will be briefly described. In the measurement period, the potential of the one of the source terminal and the drain terminal of the transistor 804 (i.e., the potential V2) and the potential of the other of the source terminal and the drain terminal of the transistor 808 (i.e., the potential V1) are fixed to a low potential. On the other hand, the potential of the node A is not fixed (the node A is in a floating state) in the measurement period. Accordingly, charge flows through the transistor 804, and the amount of charge held in the node A changes over time. Further, as the amount of charge held in the node A changes, the potential of the node A changes. In addition, the output potential Vout of the output terminal also changes.

Figure 20:
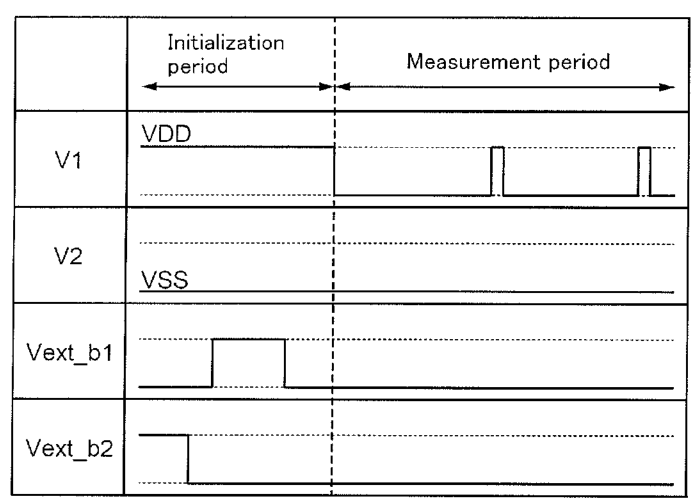
FIG. 20 is a timing chart for evaluating characteristics of the transistor including an oxide semiconductor.

FIG. 20 shows details (a timing chart) of the relation among potentials in the initialization period in which the potential difference is generated and in the following measurement period.

In the initialization period, first, the potential Vext_b2 is set to a potential (a high potential) at which the transistor 804 is turned on. Thus, the potential of the node A conies to be V2, that is, a low potential (VSS). After that, the potential Vext_b2 is set to a potential (a low potential) at which the transistor 804 is turned off, whereby the transistor 804 is turned off. Then, the potential Vext_b1 is set to a potential (a high potential) at which the transistor 808 is turned on. Thus, the potential of the node A comes to be V1, that is, a high potential (VDD). After that, the potential Vext_b1 is set to a potential at which the transistor 808 is turned off. Thus, the node A is brought into a floating state and the initialization period is completed.

In the following measurement period, the potential V1 and the potential V2 are set to potentials at which charge flows to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When a potential difference is generated and the measurement period is started as described above, the amount of charge held in the node A changes over time and the potential of the node A changes accordingly. This means that the potential of the gate terminal of the transistor 805 changes and the output potential Vout of the output terminal also changes over time.

A method of calculating the off-state current on the basis of the obtained output potential Vout will be described below.

The relation between the potential $V_A$ of the node A and the output potential Vout is obtained before the off-state current is calculated, whereby the potential $V_A$ of the node A can be obtained on the basis of the output potential Vout. From the relation described above, the potential $V_A$ of the node A can be expressed as a function of the output potential Vout by the following equation.

$$V_A=F(V\text{out}) \quad \text{[FORMULA 1]}$$

Charge $Q_A$ of the node A is expressed by the following equation, with the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A=C_AV_A+\text{const} \quad \text{[FORMULA 2]}$$

Since current $I_A$ of the node A is the time derivative of charge flowing to the node A (or charge flowing from the node A), the current $I_A$ of the node A is expressed by the following equation $$I_A=\frac{\Delta Q_A}{\Delta t}=\frac{C_A\cdot\Delta F(Vout)}{\Delta t} \quad \text{[FORMULA 3]}$$

In this mariner, the current $I_A$ of the node A can be obtained from the capacitance $C_A$ connected to the node A and the output potential Vout of the output terminal.

By the method described above, leakage current (off-state current) flowing between a source and a drain of a transistor which is in an off state can be calculated.

In this example, the transistor 804, the transistor 805, the transistor 806, and the transistor 808 with a channel length L of 10 μm and a channel width W of 50 μm were manufactured using a purified oxide semiconductor. In the measurement systems 800 which are arranged in parallel, the capacitance of the capacitors 802 were 100 fF, 1 pF, and 3 pF.

Note that in the measurement according to this example, VDD was 5 V and VSS was 0 V. In the measurement period, Vout was measured while the potential V1 was basically set to VSS and changed to VDD only for 100 milliseconds every 10 to 300 seconds. Further, Δt used in calculation of current I flowing through the element was approximately 30000 seconds.

Figure 21:
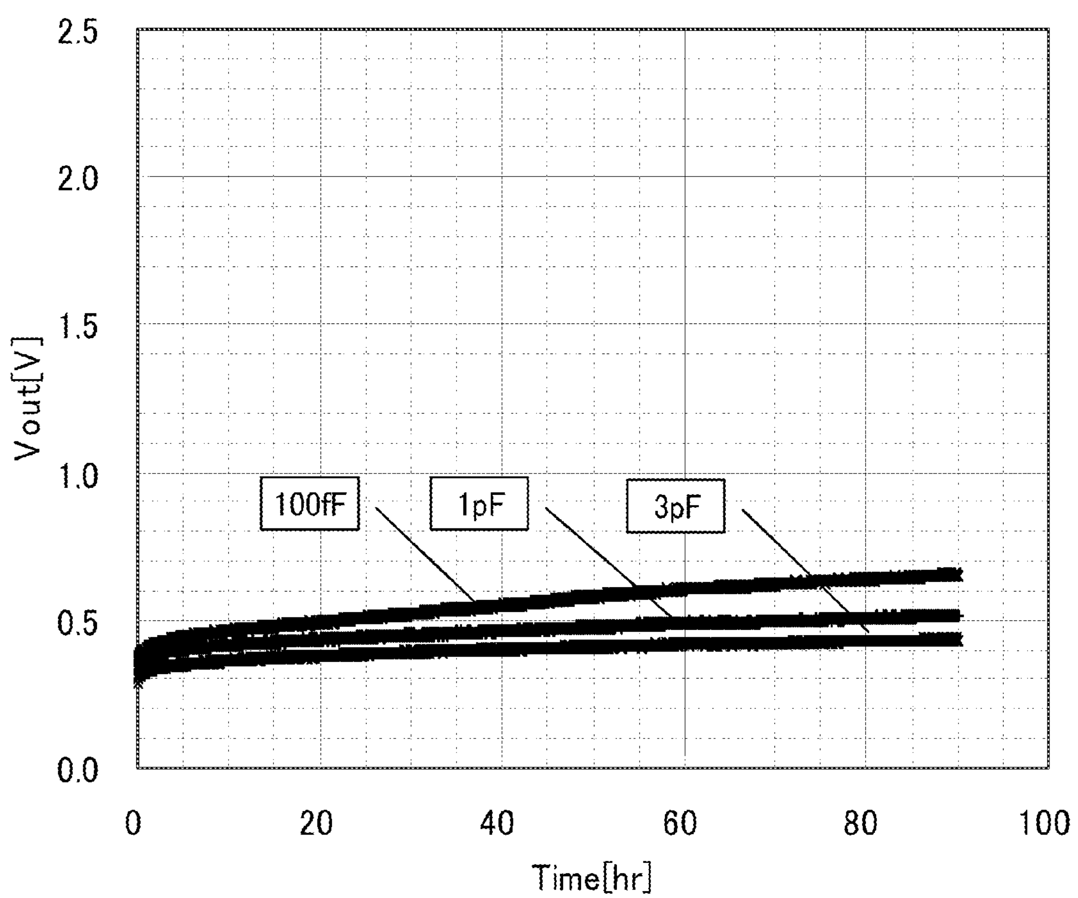
FIG. 21 is a graph showing the characteristics of the transistor including an oxide semiconductor.

FIG. 21 shows the relation between the output potential Vout and the elapsed time Time in the current measurement. As is seen in FIG. 21, the potential changes over time.

Figure 22:
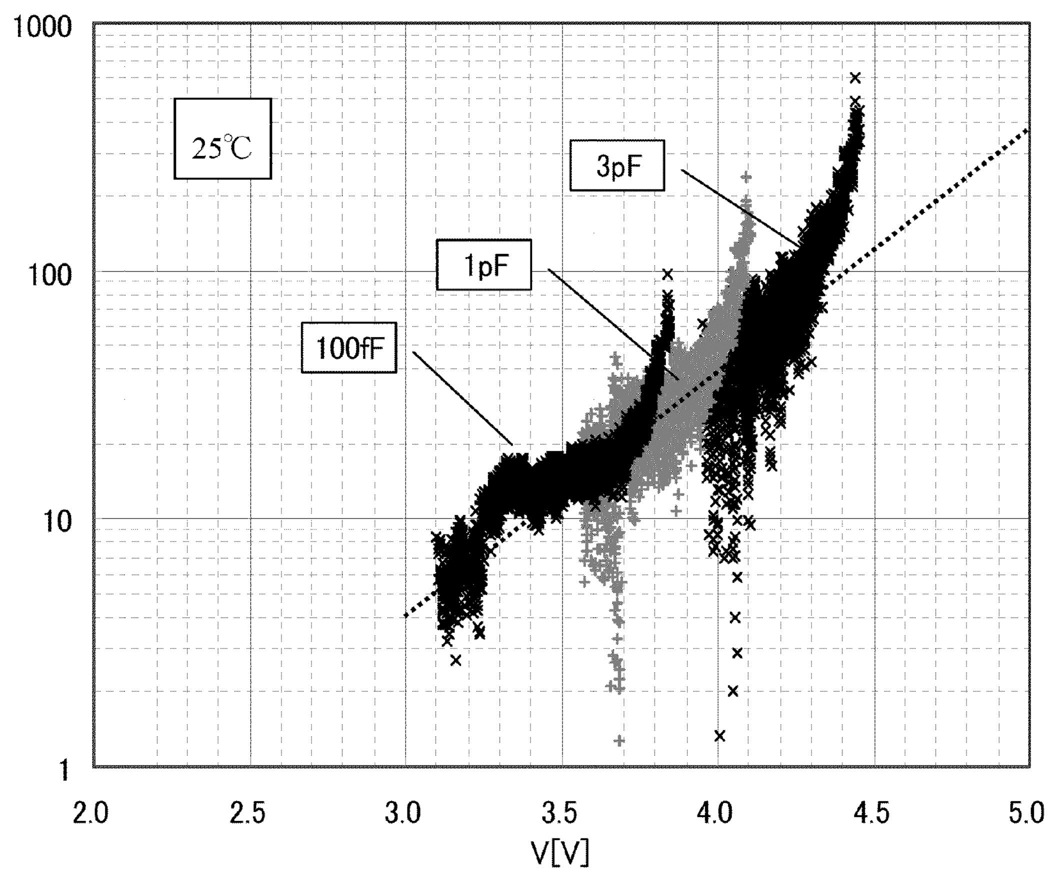
FIG. 22 is a graph showing the characteristics of the transistor including an oxide semiconductor.

FIG. 22 shows the off-state current at room temperature (25° C.) calculated in the above current measurement. Note that FIG. 22 shows the relation between the source-drain voltage V and the off-state current I. According to FIG. 22, the off-state current was approximately 40 zA/μm when the source-drain voltage was 4 V. In addition, the off-state current was lower than or equal to 10 zA/μm when the source-drain voltage was 3.1 V. Note that 1 zA is equivalent to $10^{-21}$ A.

Figure 23:
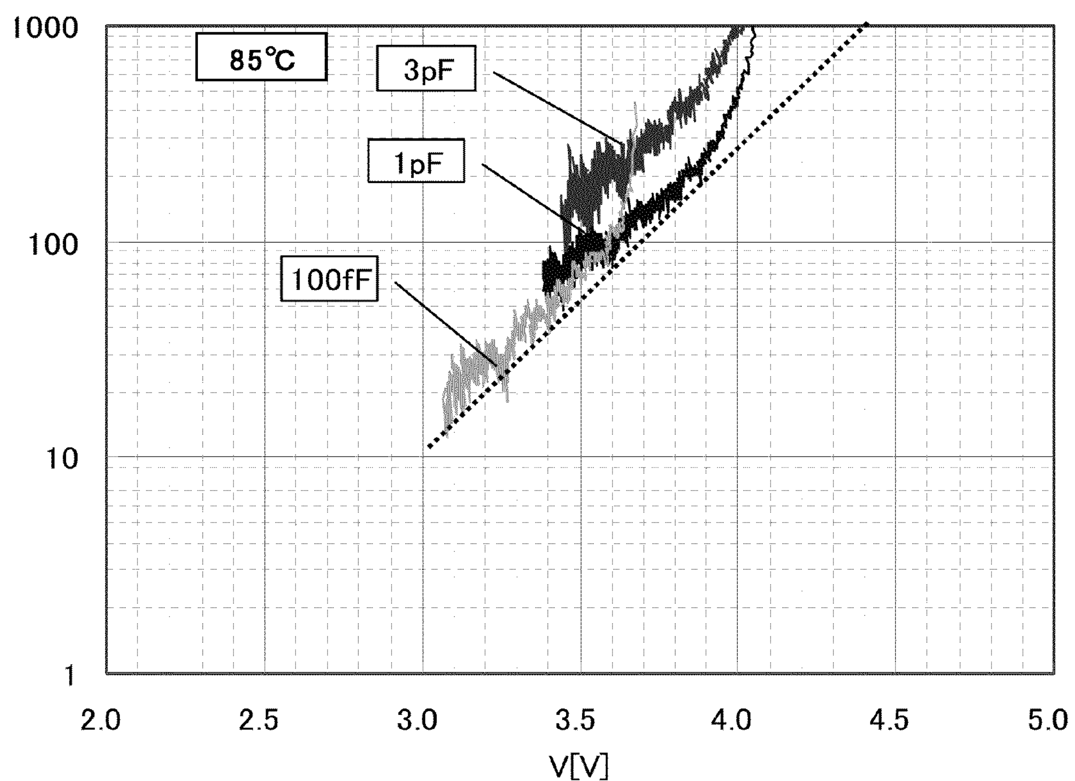
FIG. 23 is a graph showing the characteristics of the transistor including an oxide semiconductor.

Further, FIG. 23 shows the off-state current at the time when the temperature is 85° C. calculated in the above current measurement. FIG. 23 shows the relation between the source-drain voltage V and the off-state current I at the time when the temperature is 85° C. According to FIG. 23, the off-state current was less than or equal to 100 zA/μm when the source-drain voltage was 3.1 V.

As described above, according to this example, it was confirmed that the off-state current can be sufficiently low in a transistor including a purified oxide semiconductor.

EXAMPLE 2

The number of times the semiconductor device can rewrite data according to one embodiment of the disclosed invention was examined. In this example, the examination results will be described with reference to FIG. 24.

A semiconductor device used for the examination is the semiconductor device having the circuit configuration illustrated in FIG. 11A. Here, an oxide semiconductor was used in a transistor corresponding to the transistor 162, and a capacitor with a capacitance of 0.33 pF was used as a capacitor corresponding to the capacitor 164.

The examination was performed by comparing the initial memory window width and the memory window width after storing and writing of data were repeated a predetermined number of times. Data was stored and written by applying 0 V or 5 V to a wiring corresponding to the third line in FIG. 11A and applying 0 V or 5 V to a wiring corresponding to the fourth line. When the potential of the wiring corresponding to the fourth line is 0 V, the transistor (the writing transistor) corresponding to the transistor 162 is off; thus, a potential applied to a floating gate portion FG is held. When the potential of the wiring corresponding to the fourth line is 5 V, the transistor corresponding to the transistor 162 is on; thus, a potential of the wiring corresponding to the third line is supplied to the floating gate portion FG.

The memory window width is one of the indicators of the memory device characteristics. Here, the memory window width refers to the shift amount ΔVcg in curves (Vcg–Id curves) between different memory states, which show the relation between a potential Vcg of a wiring corresponding to the fifth line and a drain current Id of a transistor (a reading transistor) corresponding to the transistor 160. The different memory states refer to a state where 0 V is applied to the floating gate portion FG (hereinafter referred to as a Low state) and a state where 5 V is applied to the floating gate portion FG (hereinafter referred to as a High state). In other words, the memory window width can be obtained by sweeping the potential Vcg in the Low state and in the High state. Here, the potential Vcg was swept in a range of −2 V to 5 V in the Low state, and the potential Vcg was swept in a range of −7 V to 0 V in the High state. In both cases, the potential difference between the source electrode and the drain electrode Vds was 1 V.

Figure 24:
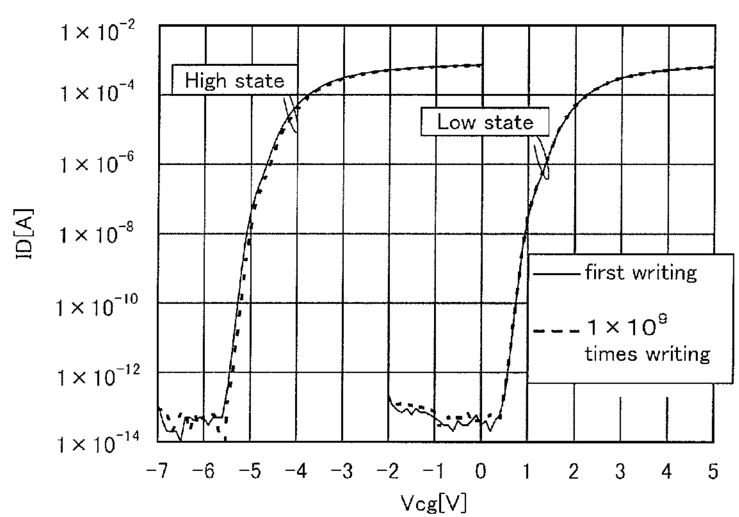
FIG. 24 is a graph showing examination results of the memory window width.

FIG. 24 shows the examination results of the initial memory window width and the memory window width after writing was performed $1\times10^9$ times. Note that in FIG. 24, the horizontal axis represents Vcg (V) and the vertical axis represents Id (A). The solid lines represent characteristic curves in the first writing, and the dashed lines represent characteristic curves after writing was performed $1\times10^9$ times. In both the solid lines and the dashed lines, the left curves are the characteristic curves in the High state and the right curves are the characteristic curves in the Low state. According to FIG. 24, the memory window width was not changed after data was written $1\times10^9$ times, which means that at least during the period, the characteristics of the semiconductor device are not changed.

As described above, characteristics of the semiconductor device according to one embodiment of the disclosed invention are not changed after storing and writing of data were repeated as many as $1\times10^9$ times, and the semiconductor device is highly resistant to repeated writing. In other words, it can be said that a semiconductor device with extremely high reliability can be achieved according to one embodiment of the disclosed invention.

This application is based on Japanese Patent Application serial no. 2010-024579 filed with Japan Patent Office on Feb. 5, 2010, the entire contents of which are hereby incorporated by reference.

The invention claimed is:

1. A semiconductor device comprising:

a plurality of memory cells each including a first transistor and a second transistor, the first transistor comprising:

a first channel formation region;

impurity regions sandwiching the first channel formation region;

metal compound regions over and in contact with the impurity regions;

a first gate insulating layer over the first channel formation region;

a first gate electrode over the first gate insulating layer, overlapping with the first channel formation region; and a first source electrode and a first drain electrode electrically connected to the first channel formation region through the metal compound regions, the second transistor comprising:

a second channel formation region;

a second source electrode and a second drain electrode electrically connected to the second channel formation region;

a second gate electrode overlapping with the second channel formation region; and a second gate insulating layer between the second channel formation region and the second gate electrode, wherein the first transistor and the second transistor are provided so that at least parts of the first transistor and the second transistor overlap with each other, and wherein the first gate electrode is in direct contact with one of the second source electrode and the second drain electrode.

2. The semiconductor device according to claim 1, wherein the first channel formation region and the second channel formation region include different semiconductor materials.

3. The semiconductor device according to claim 1, further comprising a wiring connecting one of the plurality of memory cells to another memory cell, wherein the wiring is electrically connected to one of the first source electrode and the first drain electrode through the other of the second source electrode and the second drain electrode, wherein a first region in which the one of the first source electrode and the first drain electrode and the other of the second source electrode and the second drain electrode are in contact with each other overlaps with a second region in which the other of the second source electrode and the second drain electrode is in contact with the wiring.

4. The semiconductor device according to claim 1, wherein the other of the second source electrode and the second drain electrode and the one of the first source electrode and the first drain electrode are the same.

5. The semiconductor device according to claim 1, wherein the second channel formation region includes an oxide semiconductor.

6. The semiconductor device according to claim 1, wherein the metal compound regions includes at least one of titanium, tantalum, tungsten, nickel, cobalt, and platinum.

7. A semiconductor device comprising:

m (m is an integer of 2 or more) signal lines;

m word lines;

n (n is an integer of 2 or more) bit lines;

k (k is a natural number less than n) source lines;

(m×n) memory cells arranged in matrix;

a first driver circuit electrically connected to the bit lines;

a second driver circuit electrically connected to the source lines;

a third driver circuit electrically connected to the signal lines; and a fourth driver circuit electrically connected to the word lines, wherein one of the memory cells comprises:

a first transistor comprising a first gate electrode, a first source electrode, a first drain electrode, a first channel formation region, impurity regions, and metal compound regions, the impurity regions sandwiching the first channel formation region, and the metal compound regions being over and in contact with the impurity regions;

a second transistor comprising a second gate electrode, a second source electrode, a second drain electrode, and a second channel formation region; and a capacitor, wherein one of the second source electrode and the second drain electrode includes one of electrodes of the capacitor, wherein the first gate electrode is in direct contact with the one of the second source electrode and the second drain electrode, wherein one of the source lines and the first source electrode are electrically connected to each other, wherein one of the word lines and the other of the electrodes of the capacitor are electrically connected to each other, wherein one of the signal lines and the second gate electrode are electrically connected to each other, and wherein one of the source lines is electrically connected to the first source electrode included in j (j is an integer greater than or equal to (m+1) and less than or equal to (m×n)) memory cells.

8. The semiconductor device according to claim 7, wherein the first channel formation region and the second channel formation region include different semiconductor materials.

9. The semiconductor device according to claim 7, wherein one of the bit lines connects the one of the memory cells to another memory cell, and wherein a first region in which one of the first source electrode and the first drain electrode and the other of the second source electrode and the second drain electrode are in contact with each other overlaps with a second region in which the other of the second source electrode and the second drain electrode is in contact with the one of the bit lines.

10. The semiconductor device according to claim 7, wherein the other of the second source electrode and the second drain electrode and one of the first source electrode and the first drain electrode are the same.

11. The semiconductor device according to claim 7, wherein the second channel formation region includes an oxide semiconductor.

12. The semiconductor device according to claim 7, wherein the metal compound regions includes at least one of titanium, tantalum, tungsten, nickel, cobalt, and platinum.

13. A semiconductor device comprising:

m (m is an integer of 2 or more) signal lines;

m word lines;

n (n is an integer of 2 or more) bit lines;

k (k is a natural number less than n) source lines;

(m×n) memory cells arranged in matrix;

a first driver circuit electrically connected to the bit lines;

a second driver circuit electrically connected to the source lines;

a third driver circuit electrically connected to the signal lines; and a fourth driver circuit electrically connected to the word lines, wherein one of the memory cells comprises:

a first transistor comprising a first gate electrode, a first source electrode, a first drain electrode, a first channel formation region, impurity regions, and metal compound regions, the impurity regions sandwiching the first channel formation region, and the metal compound regions being over and in contact with the impurity regions;

a second transistor comprising a second gate electrode, a second source electrode, a second drain electrode, and a second channel formation region; and a capacitor, wherein one of the second source electrode and the second drain electrode includes one of electrodes of the capacitor, wherein the first gate electrode is in direct contact with the one of the second source electrode and the second drain electrode, wherein one of the source lines and the first source electrode are electrically connected to each other, wherein one of the word lines and the other of the electrodes of the capacitor are electrically connected to each other, wherein one of the signal lines and the second gate electrode are electrically connected to each other, and wherein one of the source lines is electrically connected to the first source electrode included in (m×n/k) memory cells.

14. The semiconductor device according to claim 13, wherein the first channel formation region and the second channel formation region include different semiconductor materials.

15. The semiconductor device according to claim 13, wherein one of the bit lines connects the one of the memory cells to another memory cell, and wherein a first region in which one of the first source electrode and the first drain electrode and the other of the second source electrode and the second drain electrode are in contact with each other overlaps with a second region in which the other of the second source electrode and the second drain electrode is in contact with the one of the bit lines.

16. The semiconductor device according to claim 13, wherein the other of the second source electrode and the second drain electrode and one of the first source electrode and the first drain electrode are the same.

17. The semiconductor device according to claim 13, wherein the second channel formation region includes an oxide semiconductor.

18. The semiconductor device according to claim 13, wherein the metal compound regions includes at least one of titanium, tantalum, tungsten, nickel, cobalt, and platinum.

* * * * *